US008809886B2

(12) United States Patent
Zhang et al.

(10) Patent No.: US 8,809,886 B2
(45) Date of Patent: *Aug. 19, 2014

(54) LIGHT EMITTING DIODE

(71) Applicants: Tsinghua University, Beijing (CN); Hon Hai Precision Industry Co., Ltd., New Taipei (TW)

(72) Inventors: Hao-Su Zhang, Beijing (CN); Jun Zhu, Beijing (CN); Qun-Qing Li, Beijing (CN); Guo-Fan Jin, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/729,351

(22) Filed: Dec. 28, 2012

(65) Prior Publication Data

US 2013/0328081 A1    Dec. 12, 2013

(30) Foreign Application Priority Data

Jun. 7, 2012  (CN) .......................... 2012 1 0185725

(51) Int. Cl.
*H01L 33/44*       (2010.01)
(52) U.S. Cl.
USPC ........... 257/98; 257/99; 362/308; 362/311.02
(58) Field of Classification Search
USPC .................. 257/98, 99; 362/308, 309, 311.02
See application file for complete search history.

(56) References Cited

U.S. PATENT DOCUMENTS

| 8,159,000 | B2* | 4/2012 | Lee et al. .......................... 257/99 |
| 8,183,591 | B2* | 5/2012 | Kim ................................ 257/99 |
| 2010/0123166 | A1* | 5/2010 | Bae ............................... 257/103 |
| 2012/0113656 | A1* | 5/2012 | Iwanaga et al. ................ 362/382 |
| 2013/0328076 | A1* | 12/2013 | ZHU et al. ...................... 257/94 |
| 2013/0328079 | A1* | 12/2013 | ZHANG et al. ................. 257/98 |
| 2013/0328080 | A1* | 12/2013 | ZHANG et al. ................. 257/98 |
| 2013/0328081 | A1* | 12/2013 | ZHANG et al. ................. 257/98 |
| 2013/0328082 | A1* | 12/2013 | ZHU et al. ...................... 257/98 |
| 2013/0328083 | A1* | 12/2013 | ZHU et al. ...................... 257/98 |
| 2013/0328084 | A1* | 12/2013 | ZHU et al. ...................... 257/98 |
| 2013/0330859 | A1* | 12/2013 | Zhang et al. .................... 438/29 |
| 2013/0330860 | A1* | 12/2013 | ZHANG et al. ................. 438/29 |
| 2013/0330861 | A1* | 12/2013 | ZHU et al. ...................... 438/29 |
| 2013/0330862 | A1* | 12/2013 | ZHU et al. ...................... 438/29 |
| 2013/0330863 | A1* | 12/2013 | ZHU et al. ...................... 438/29 |
| 2013/0330864 | A1* | 12/2013 | ZHU et al. ...................... 438/29 |

* cited by examiner

*Primary Examiner* — Earl Taylor
(74) *Attorney, Agent, or Firm* — Novak Druce Connolly Bove + Quigg LLP

(57) ABSTRACT

A light emitting diode includes a substrate, a first semiconductor layer, an active layer, a second semiconductor layer, a third optical symmetric layer, a metallic layer, a fourth optical symmetric layer, and a first optical symmetric layer, and a second optical symmetric layer stacked with other in the listed sequence. The light emitting diode further includes a first electrode electrically connected with the first semiconductor layer and a second electrode electrically connected with the second semiconductor layer. A refractive index of the third optical symmetric layer or the fourth optical symmetric layer is in a range from about 1.2 to about 1.5. A refractive index difference between the source layer and the first optical symmetric layer is less than or equal to 0.3. A refractive difference between the second optical symmetric layer and the substrate is less than or equal to 0.1.

13 Claims, 18 Drawing Sheets

LIGHT EMITTING DIODE

CROSS-REFERENCE TO RELATED APPLICATIONS

This application claims all benefits accruing under 35 U.S.C. §119 from China Patent Application No. 201210185723.4, filed on Jun. 7, 2012, in the China Intellectual Property Office, the contents of which are hereby incorporated by reference. This application is related to commonly-assigned applications entitled, "SEMICONDUCTOR STRUCTURE", filed on Dec. 28, 2012, Ser. No. 13/729,284; "METHOD FOR MAKING LIGHT EMITTING DIODE", filed on Dec. 28, 2012, Ser. No. 13/729,292; "LIGHT EMITTING DIODE", filed on Dec. 28, 2012, Ser. No. 13/729,310; "METHOD FOR MAKING LIGHT EMITTING DIODE", filed on Dec. 28, 2012, Ser. No. 13/729,363; "SEMICONDUCTOR STRUCTURE", filed on Dec. 28, 2012, Ser. No. 13/729,393; "METHOD FOR MAKING LIGHT EMITTING DIODE", filed on Dec. 28, 2012, Ser. No. 13/729,427; "LIGHT EMITTING DIODE", filed on Dec. 28, 2012, Ser. No. 13/729,438; "METHOD FOR MAKING LIGHT EMITTING DIODE", filed on Dec. 28, 2012, Ser. No. 13/729,487; "LIGHT EMITTING DIODE", filed on Dec. 28, 2012, Ser. No. 13/729,506, the contents of the above commonly-assigned applications are hereby incorporated by reference.

BACKGROUND

1. Technical Field

The present disclosure relates to light emitting diodes.

2. Description of Related Art

Semiconductor structures fabricated by gallium nitride for light sources, such as blue, green, and white light sources, have long lifetime, high energy conversion efficiency, and green. Therefore, the semiconductor structures are widely used as the light sources in large screen color display systems, automotive lightening, traffic lights, multimedia displays, optical communication systems, and so on.

A conventional light emitting diode used as the light source includes an N-type semiconductor layer, a P-type semiconductor layer, and an active layer located between the N-type semiconductor layer and a P-type semiconductor layer. In an operation, a positive voltage and a negative voltage are applied respectively to the P-type semiconductor layer and the N-type semiconductor layer. Thus, holes in the P-type semiconductor layer and electrons in the N-type semiconductor layer can enter the active layer and combine with each other to emit visible light, and the visible light is emitted from the light emitting diode. However, near field evanescent waves emitted from the active layer are internally reflected inside the light emitting diode, so that a large portion of the light emitted from the active layer remain in the light emitting diode, thereby degrading the light extraction efficiency.

What is needed, therefore, is to provide a light emitting diode having a high light extraction efficiency.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
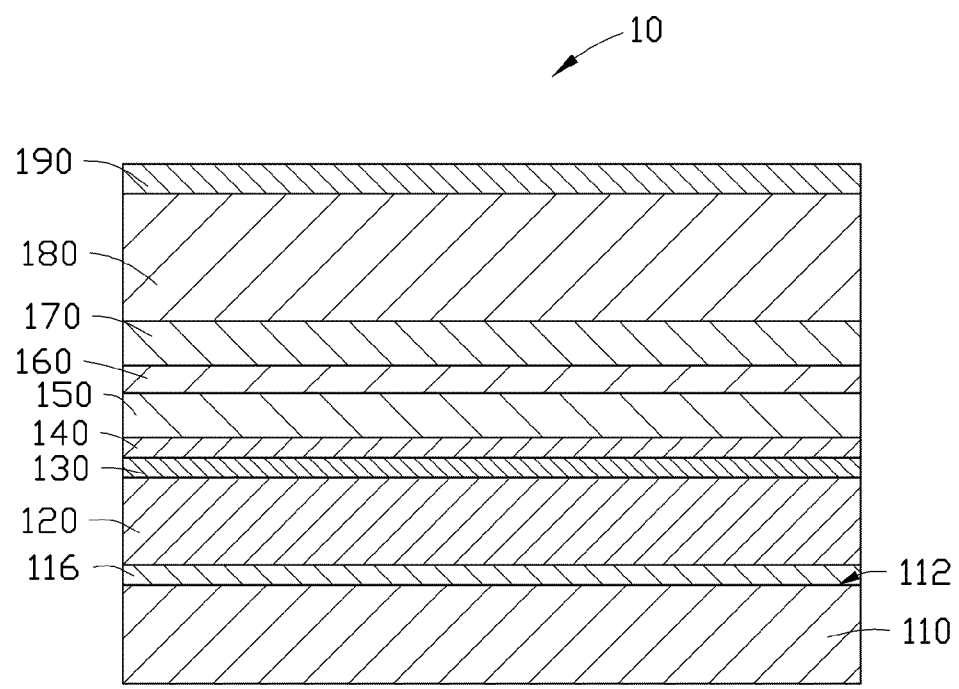
FIG. 1 is a schematic sectional view of an embodiment of a semiconductor structure.

Referring to FIG. 1, one embodiment of a semiconductor structure 10 includes a substrate 110, a buffer layer 116, a first semiconductor layer 120, an active layer 130, a second semiconductor layer 140, a third optical symmetric layer 150, a metallic layer 160, a fourth optical symmetric layer 170, a first optical symmetric layer 180, and a second optical symmetric layer 190. The buffer layer 116, the first semiconductor layer 120, the active layer 130, the second semiconductor layer 140, the third optical symmetric layer 150, the metallic layer 160, the fourth optical symmetric layer 170, the first optical symmetric layer 180, and the second optical symmetric layer 190 are stacked on a surface of the substrate 110 in sequence. A refractive index of the third optical symmetric layer 150 and the fourth optical symmetric layer 170 are substantially the same. The first semiconductor layer 120, the active layer 130, and the second semiconductor layer 140 cooperatively constitute a source layer of the semiconductor structure 10. A difference $\Delta n_1$ between a refractive index $n_1$ of the first optical symmetric layer 180 and an effective refractive index $n_2$ of the source layer and the buffer layer 116 is less than or equal to 0.3, wherein $\Delta n_1 = |n_1 - n_2|$. A difference $\Delta n_2$ of a refractive index $n_3$ of the second optical symmetric layer 190 and a refractive index $n_4$ of the substrate 110 is less than or equal to 0.1, wherein $\Delta n_2=|n_3-n_4|$. The semiconductor structure 10 is an optical symmetric structure with the metallic layer 160 as an optical symmetric center. The refractive indexes of two components of the semiconductor structure 10 in the optical symmetric positions to the optical symmetric center are close. The optical symmetric structure refers to two components in the optical symmetric position that have a close refractive index. In one embodiment, the two components in the optical symmetric position have a close refractive index and a close thickness.

The substrate 110 can be a transparent structure having an epitaxial growth surface 112 used to grow the first semiconductor layer 120. The epitaxial growth surface 112 is a smooth surface. Oxygen and carbon are removed from the surface 112. The substrate 110 can be a single layer structure or a multiple layer structure. If the substrate 110 is a single layer structure, the substrate 110 can be a single-crystal structure. The single-crystal structure includes a crystal plane which is used as the epitaxial growth surface 112. A material of the substrate 110 can be silicon on insulator (SOI), $LiGaO_2$, $LiAlO_2$, $Al_2O_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. If the substrate 110 is the multiple layer structure, the substrate 110 should include at least one layer of the single-crystal structure mentioned previously. The material of the substrate 110 can be selected according to the first semiconductor layer 120. In one embodiment, a lattice constant and thermal expansion coefficient of the substrate 110 is similar to the first semiconductor layer 120 thereof to improve a quality of the first semiconductor layer 120. In one embodiment, the material of the substrate 110 is sapphire. A thickness, shape, and size of the substrate 110 are arbitrary and can be selected according to need.

The buffer layer 116 is disposed between and contacting the substrate 110 and the first semiconductor layer 120. The buffer layer 116 is disposed on the epitaxial growth surface 112 of the substrate 110 to improve a quality of growth of the first semiconductor layer 120 via a decrease of the lattice mismatch. A thickness of the buffer layer 116 can be in a range from about 10 nanometers to about 300 nanometers. In one embodiment, the thickness of the buffer layer 116 is in a range from about 20 nanometers to about 50 nanometers. A material of the buffer layer 116 can be GaN or AlN. In one embodiment, the thickness of the buffer layer 116 is about 20 nanometers and the material of the buffer layer 116 is a low temperature GaN. The buffer layer 116 is an optional element.

A thickness of the first semiconductor layer 120 can be in a range from about 1 micrometer to about 15 micrometers. The first semiconductor layer 120 can be a doped semiconductor layer. The doped semiconductor layer can be an N-type semiconductor layer or a P-type semiconductor layer. A material of the N-type semiconductor layer can be at least one of N-type GaN, N-type GaAs, and N-type cupric phosphide. A material of the P-type semiconductor layer can be at least one of P-type GaN, P-type GaAs, and P-type cupric phosphide. The N-type semiconductor layer is configured to provide electrons, and the P-type semiconductor layer is configured to provide holes. In one embodiment, the material of the first semiconductor layer 120 is the N-type GaN doped with Si element, and the thickness of the first semiconductor layer 120 is about 1460 nanometers.

The second semiconductor layer 140 can be the N-type semiconductor layer or the P-type semiconductor layer, and the types of the first semiconductor layer 120 and the second semiconductor layer 140 are different to form a PN conjunction. The second semiconductor layer 140 is disposed between the metallic layer 160 and the active layer 130. A thickness of the second semiconductor layer 140 is smaller than or equal to 210 nanometers. In one embodiment, the thickness of the second semiconductor layer 140 is in a range from about 5 nanometers to about 20 nanometers. In one embodiment, the thickness of the second semiconductor layer 140 is in a range from about 10 nanometers to about 20 nanometers. In one embodiment, the thickness of the second semiconductor layer 140 is in a range from about 10 nanometers to about 30 nanometers. In one embodiment, the thickness of the second semiconductor layer 140 is about 10 nanometers, about 15 nanometers, about 20 nanometers, or about 30 nanometers. In one embodiment, the second semiconductor layer 140 is the P-type GaN doped with Mg element, and the thickness of the second semiconductor layer 140 is about 10 nanometers.

The active layer 130 is a photon excitation layer to provide a location for the combination of the electrons and holes. Photons are produced in the active layer 130 when the electrons and holes are combined. The active layer 130 can be one of a single layer quantum well film or multilayer quantum well film. A material of the quantum well film can be at least one of GaInN, AlGaInN, GaAs, GaAlAs, GaInP, InAsP, and InGaAs. A thickness of the active layer 130 can be in a range from about 0.01 micrometers to about 0.6 micrometers. In one embodiment, the material of the active layer 130 is a composition of InGaN and GaN, and the thickness of the active layer 130 is about 10 nanometers.

The effective refractive index $n_2$ of the source layer and the buffer layer 116 can be in a range from about 2.0 to about 3.5 depending on the material of the source layer and the buffer layer 116. In one embodiment, the material of the buffer layer 116 is the low temperature GaN, the material of the first semiconductor layer 120 is the N-type GaN, the material of the active layer 130 is the composition InGaN/GaN, and the material of the second semiconductor layer 140 is the P-type GaN. With similar materials, the refractive indexes of the buffer layer 116, the first semiconductor layer 120, the active layer 130, and the second semiconductor layer 140 are also similar. In one embodiment, the effective refractive index $n_2$ of the source layer and the buffer layer 116 is about 2.5.

A material of the metallic layer 160 can be selected according to wave lengths of light generated in the active layer 130. Lights with long wave lengths can be well extracted from the active layer 130. A material of the metallic layer 160 can be an elemental metal or an alloy, such as gold, silver, aluminum, copper, gold-silver alloy, gold-aluminum alloy, or silver-aluminum alloy. The metallic layer 160 of the silver is good for extraction of purple light and blue light. The metallic layer 160 of the aluminum is good for extraction of wavelengths smaller than the wavelength of purple light. The metallic layer 160 of gold is good for extraction of red light and green light.

A thickness of the metallic layer 160 can be in a range from about 10 nanometers to about 30 nanometers. In one embodiment, the thickness of the metallic layer 160 is in a range from about 20 nanometers to about 30 nanometers. In one embodiment, the thickness of the metallic layer 160 is in a range from about 15 nanometers to about 20 nanometers. In one embodiment, the thickness of the metallic layer 160 is in a range from about 10 nanometers to about 15 nanometers. In one embodiment, the thickness of the metallic layer 160 is about 10 nanometers, about 15 nanometers, about 20 nanometers, about 25 nanometers, or about 30 nanometers. In one embodiment, the thickness of the metallic layer 160 is about 15 nanometers.

The function of the metallic layer 160 is as follows. First, near field evanescent waves generated by the active layer 130, when arriving the metallic layer 160, can be amplified and converted to a metallic plasma by the metallic layer 160. The metallic plasma is then scattered by the metallic layer 160 and spreads around the metallic layer 160. The metallic layer 160 is the optical symmetric center of the semiconductor structure 10 and there are close refractive indexes in the optical symmetric positions of the semiconductor structure 10. Therefore, the metallic plasma can be uniformly distributed and uniformly propagated to two opposite sides of the metallic layer 160. The metallic plasma can be uniformly exited passing through the second optical symmetric layer 190 and the substrate 110. Second, there is a quantum well effect between the metallic plasma and the active layer 130. The quantum well effect can cause the active layer 130 to produce more photons and the produced photons arrive at the metallic layer 160 to produce more metallic plasma. This interaction between the active layer 130 and the metallic layer 160 can produce more photons from the active layer 130, thereby increasing the extraction efficiency of the semiconductor structure 10. The less the distance between the metallic layer 160 and the active layer 130, the better the interaction thereof, and the more uniformly a current in the second semiconductor layer 140 is distributed.

The difference $\Delta n_1$ between the refractive index $n_1$ of the first optical symmetric layer 180 and the effective refractive index $n_2$ of the source layer and the buffer layer 116 is less than or equal to 0.3. In one embodiment, the difference $\Delta n_1$ is less than or equal to 0.2 or 0.1. The smaller the difference $\Delta n_1$, the closer the refractive index $n_1$ of the first optical symmetric layer 180 and the effective refractive index $n_2$ of the source layer and the buffer layer 116. Therefore, light intensities extracted from the second optical symmetric layer 190 and the substrate 110 are good. Therefore, the light can be uniformly extracted from the semiconductor structure 10.

The refractive index $n_1$ of the first optical symmetric layer 180 can be in a range from about 2.0 to about 3.5. In one embodiment, the refractive index $n_1$ is in a range from about 2.2 to about 2.8. In one embodiment, the refractive index $n_1$ is in a range from about 2.2 to about 2.4. In one embodiment, the refractive index $n_1$ is in a range from about 2.4 to about 2.6. In one embodiment, the refractive index $n_1$ is in a range from about 2.6 to about 2.8. A material of the first optical symmetric layer 180 can be titanium dioxide, hafnium oxide, zirconia, or polyimide. In one embodiment, the buffer layer 116 is the low temperature GaN, the material of the first semiconductor layer 120 is the N-type GaN, the material of the active layer 130 is the composition InGaN/GaN, the material of the second semiconductor layer 140 is the P-type GaN, the effective refractive index $n_2$ of the above four components is about 2.5, the material of the first optical symmetric layer 180 is the titanium dioxide, and the refractive index $n_1$ is about 2.55. The titanium dioxide has good transparency. Therefore, the light can be easily accessed.

A thickness difference between the first optical symmetric layer 180 and the total thickness of the buffer layer 116 and the source layer can be smaller than or equal to 150 nanometers. The closer the thickness between the first optical symmetric layer 180 and the total thickness of the buffer layer 116 and the source layer, the more uniform the emergent light the semiconductor structure 10 can receive. The thickness of the first optical symmetric layer 180 can be in a range from about 1 micrometer to about 2 micrometers. In one embodiment, the thickness of the buffer layer 116, the first semiconductor layer 120, the active layer 130, and the second semiconductor layer 140 in the listed order are about 20 nanometers, about 1460 nanometers, about 10 nanometers, and about 10 nanometers. The total thickness of the buffer layer 116 and the source layer is about 1500 nanometers and the thickness of the first optical symmetric layer 180 is about 1500 nanometers. In other words, the thickness of the first optical symmetric layer 180 and the total thickness of the buffer layer 116 and the source layer can be substantially the same.

The third optical symmetric layer 150 is disposed between the second semiconductor layer 140 and the metallic layer 160. The third optical symmetric layer 150 includes two opposite surfaces. One of the two opposite surfaces directly contacts the second semiconductor layer 140 and the other one of the two opposite surfaces directly contacts the metallic layer 160. The third optical symmetric layer 150 can prevent the metallic plasma generated by the metallic layer 160 from being converted to heat. A propagation constant of the metallic plasma under a guided wave mode is a complex number including a real part and an imaginary part. If the imaginary part is large, the metallic plasma is easily converted to heat. A material with a low refractive index can be selected as the material of the third optical symmetric layer 150 to reduce the real part and the imaginary part at the same time. Thus, a heat consumption of the metallic plasma can be reduced and the metallic plasma can travel farther. Therefore, the extraction efficiency of the semiconductor structure 10 can be increased. A refractive index of the third optical symmetric layer 150 can be in a range from about 1.2 to about 1.5. In one embodiment, the refractive index is in a range from about 1.3 to about 1.4. In one embodiment, the refractive index is in a range from about 1.4 to about 1.5. A material of the third optical symmetric layer 150 can be silicon dioxide, magnesium fluoride, or lithium fluoride. In one embodiment, the material of the third optical symmetric layer 150 is the silicon dioxide, and the refractive index of the third optical symmetric layer 150 is about 1.5.

A thickness of the third optical symmetric layer 150 can be in a range from about 5 nanometers to about 40 nanometers. In one embodiment, the thickness of the third optical symmetric layer 150 is in a range from about 5 nanometers to about 10 nanometers. In one embodiment, the thickness of the third optical symmetric layer 150 is in a range from about 10 nanometers to about 20 nanometers. In one embodiment, the thickness of the third optical symmetric layer 150 is in a range from about 20 nanometers to about 30 nanometers. In one embodiment, the thickness of the third optical symmetric layer 150 is in a range from about 30 nanometers to about 40 nanometers. In one embodiment, the thickness of the third optical symmetric layer 150 is about 20 nanometers.

The fourth optical symmetric layer 170 is disposed between and directly contacts the metallic layer 160 and the first optical symmetric layer 180. A material and a thickness of the fourth optical symmetric layer 170 are the same as the material and the thickness of the third optical symmetric layer 150. Therefore, the metallic plasma can uniformly travel toward the substrate 110 and the second optical symmetric layer 190. The lower refractive index of the third optical symmetric layer 150 and the fourth optical symmetric layer 170, the better extraction efficiency of the semiconductor structure 10. A function of the fourth optical symmetric layer 170 is similar to the third optical symmetric layer 170 which can prevent the metallic plasma from being converted to heat, except that the metallic plasma can travel through the fourth optical symmetric layer 170.

The refractive index $n_3$ of the second optical symmetric layer 190 and the refractive index $n_4$ are close in value such that the metallic plasma can uniformly travel toward both the substrate 110 and the second optical symmetric layer 190. The difference $\Delta n_2$ of the refractive index $n_3$ of the second optical symmetric layer 190 and the refractive index $n_4$ of the substrate 110 is less than or equal to 0.1, wherein $\Delta n_2 = |n_3 - n_4|$. The closer the refractive index $n_3$ and $n_4$, the better the extraction efficiency of the semiconductor structure 10. The refractive index $n_3$ of the second optical symmetric layer 190 can be in a range from about 1.7 to about 1.8 depending on a material of the second optical symmetric layer 190. The material of the second optical symmetric layer 190 can be the same as the material of the substrate 110. A thickness of the second optical symmetric layer 190 can be in a range from about 30 nanometers to about 80 nanometers. In one embodiment, the thickness of the second optical symmetric layer 190 is in a range from about 40 nanometers to 60 nanometers. In one embodiment, the material of the second optical symmetric layer 190 is sapphire, and the thickness thereof is about 50 nanometers. The second optical symmetric layer 190 is an optional component.

In the semiconductor structure 10, the substrate 110 is optically symmetric to the second optical symmetric layer 190, the first optical symmetric layer 180 is optically symmetric to the source layer added with the buffer layer 116 (if the buffer layer is included), and the third optical symmetric layer 150 is optically symmetric to the fourth optical symmetric layer 170. Some of the two components in the symmetric position are optional in the semiconductor structure 10, such as the substrate 110 and the second optical symmetric layer 190, and the third optical symmetric layer 150 and the fourth optical symmetric layer 170.

Figure 2:
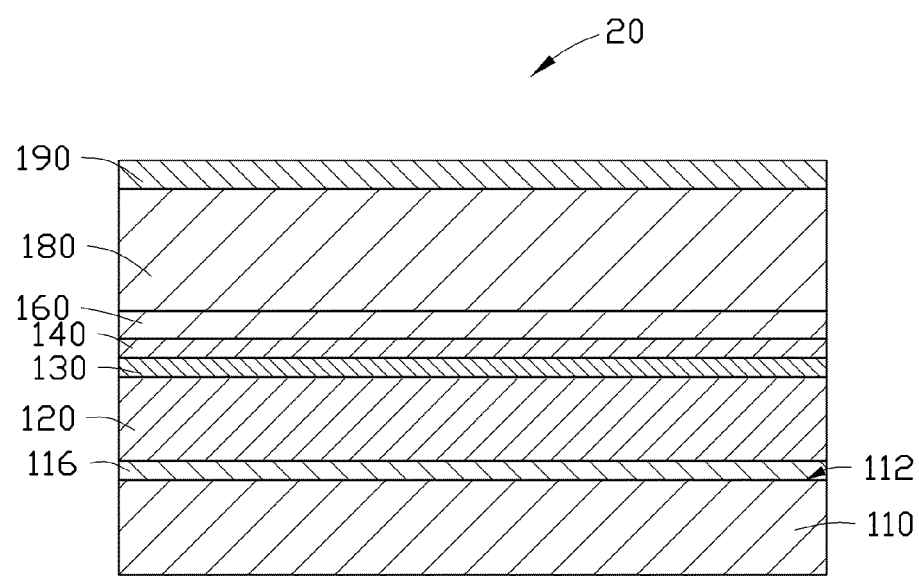
FIG. 2 is a schematic sectional view of one embodiment of a semiconductor structure.

Referring to FIG. 2, one embodiment of a semiconductor structure 20 is provided. The semiconductor structure 20 is similar to the semiconductor structure 10, except that there is no the third optical symmetric layer and the fourth optical symmetric layer in the semiconductor structure 20. In the semiconductor structure 20, the metallic layer 160 is directly disposed on a surface of the second semiconductor layer 140 which is far away from the substrate 110, and the first optical symmetric layer 180 is directly disposed on a surface of the metallic layer 160 which is far away from the substrate 110. The metallic layer 160 can cover the entire surface of the second semiconductor layer 140. The metallic layer 160 is closer to the active layer 130 in the semiconductor structure 20 than in the semiconductor structure 10. Therefore, there is a strong interaction between the metallic layer 160 and the active layer 130 which can make the active layer 130 generate more photons and the metallic layer 160 generate more metallic plasma.

Figure 3:
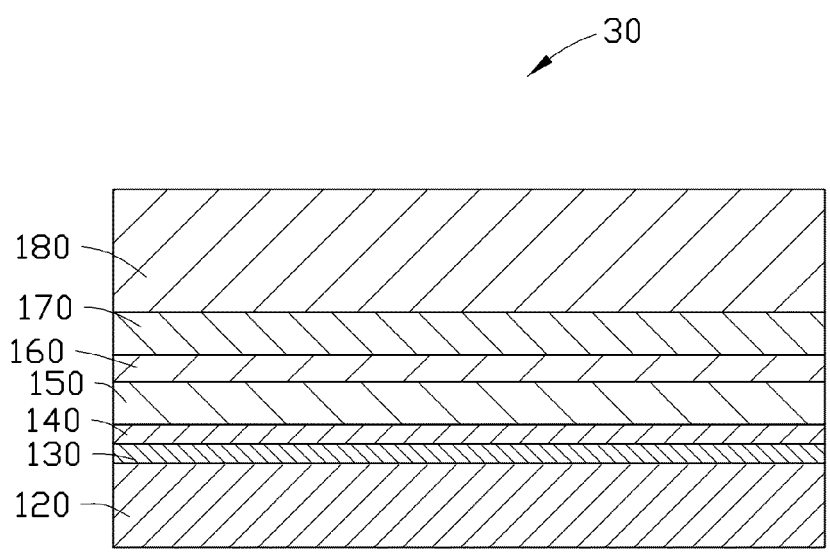
FIG. 3 is a schematic sectional view of one embodiment of a semiconductor structure.

Referring to FIG. 3, one embodiment of a semiconductor structure 30 is provided. The semiconductor structure 30 is similar to the semiconductor structure 10, except that there is no substrate, the buffer layer, and the second optical symmetric layer in the semiconductor structure 30. A refractive index difference between the first optical symmetric layer 180 and the source layer is less than or equal to 0.3 in the semiconductor structure 30, and the metallic layer is still the optical symmetric center of the semiconductor structure 30. The refractive index of the source layer is an effective refractive index of the first semiconductor layer 120, the active layer 130, and the second semiconductor layer 140. In one embodiment, the refractive index of the source layer is about 2.5.

An exposed surface of the first semiconductor layer 120 and an exposed surface of the first optical symmetric layer 180 are two light emitting surfaces of the semiconductor structure 30. Optical symmetric components on the two sides of the metallic layer 160 have a close refractive index. Therefore, lights generated from the active layer 130 can be uniformly extracted from the two light emitting surfaces. The optical symmetric components in the semiconductor structure 30 refer to the source layer and the first optical symmetric layer 180, and the third optical symmetric layer 150 and the fourth optical symmetric layer 170.

Figure 4:
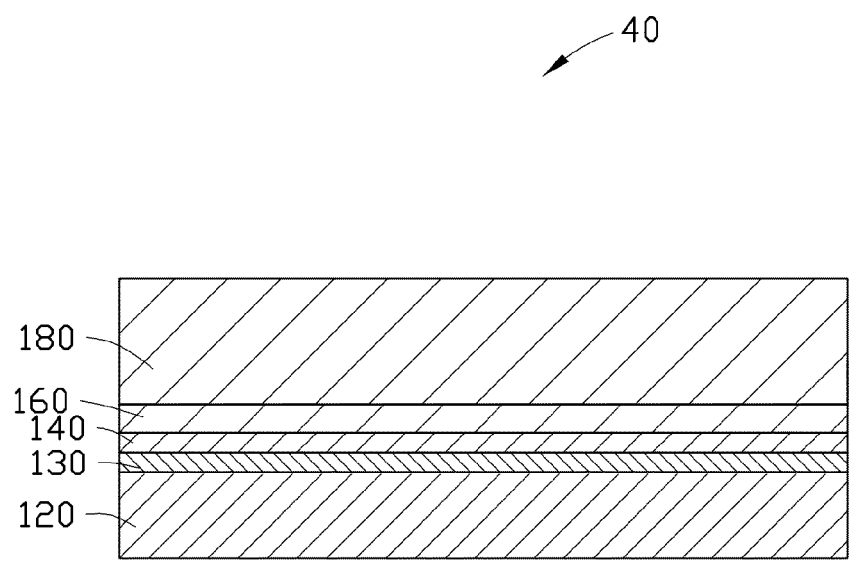
FIG. 4 is a schematic sectional view of one embodiment of a semiconductor structure.

Referring to FIG. 4, one embodiment of a semiconductor structure 40 is provided. The semiconductor structure 40 is similar to the semiconductor structure 10, except that there is no substrate, buffer layer, second optical symmetric layer, third optical symmetric layer, and fourth optical symmetric layer. The metallic layer 160 is directly disposed on the surface of the second semiconductor layer 140, and the first optical symmetric layer 180 is directly disposed on the surface of the metallic layer 160 which is far away from the second semiconductor layer 140.

Figure 5:
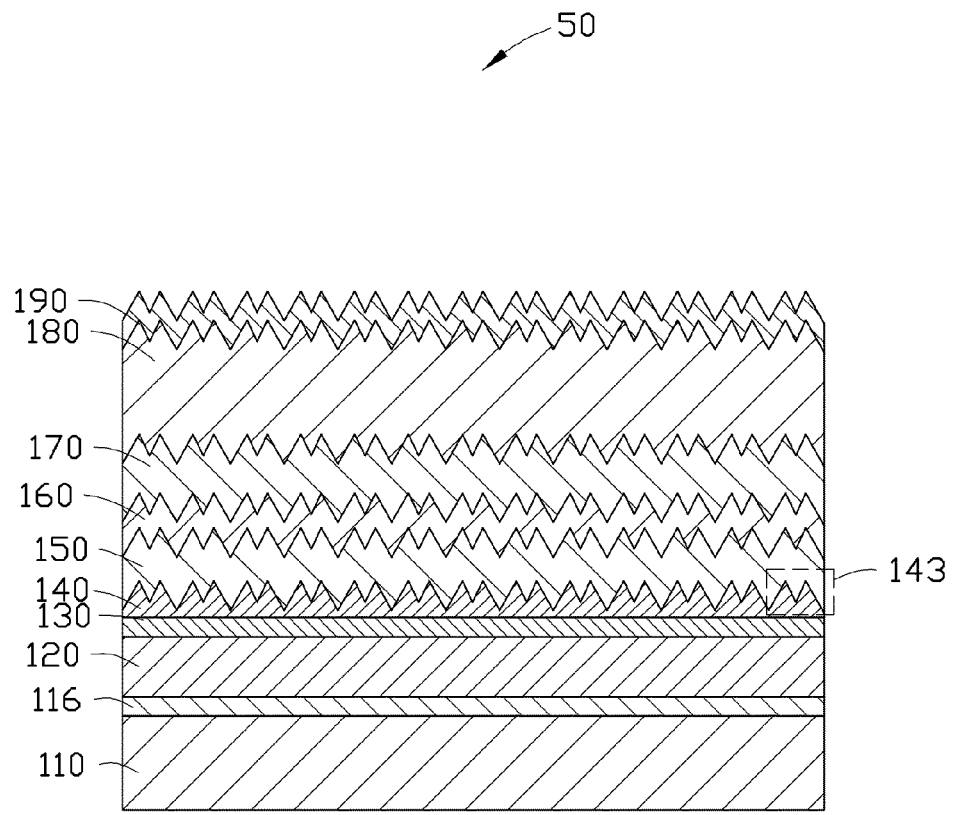
FIG. 5 is a schematic sectional view of one embodiment of a semiconductor structure.
Figure 6:
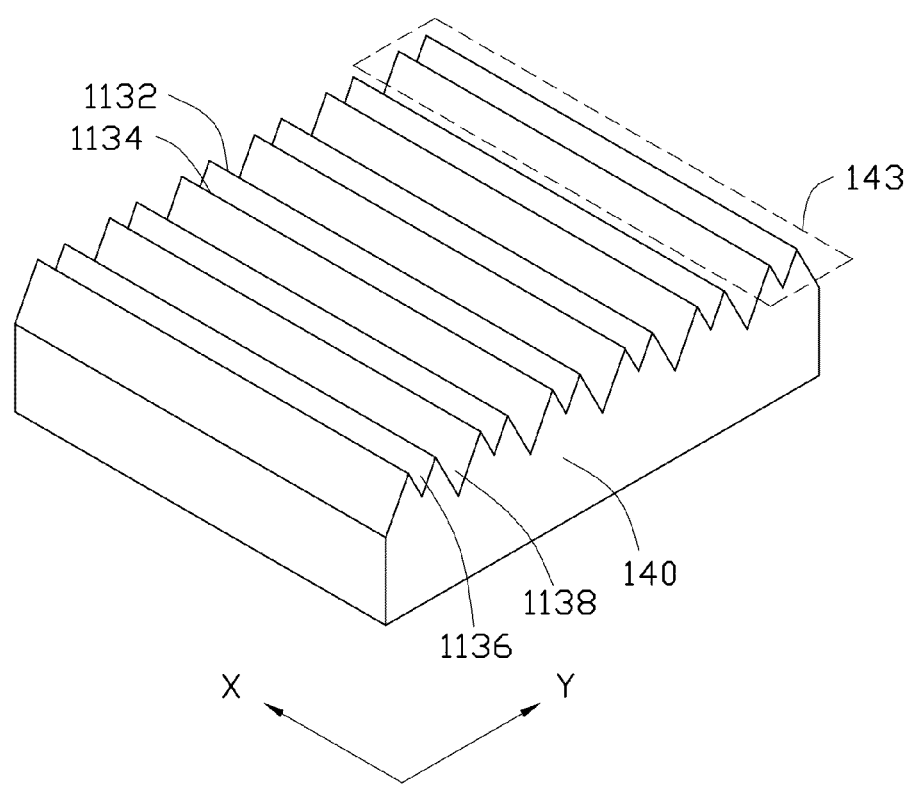
FIG. 6 is a schematic view of a second semiconductor layer having a plurality of three-dimensional nano-structures of the semiconductor structure of FIG. 5.
Figure 7:
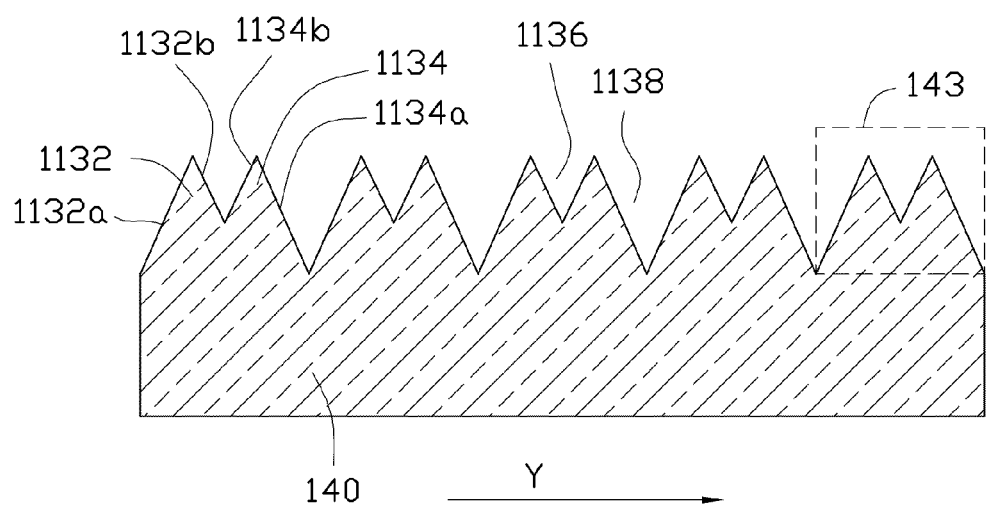
FIG. 7 is a sectional view of the second semiconductor layer having the plurality of three-dimensional nano-structures of FIG. 6.
Figure 8:
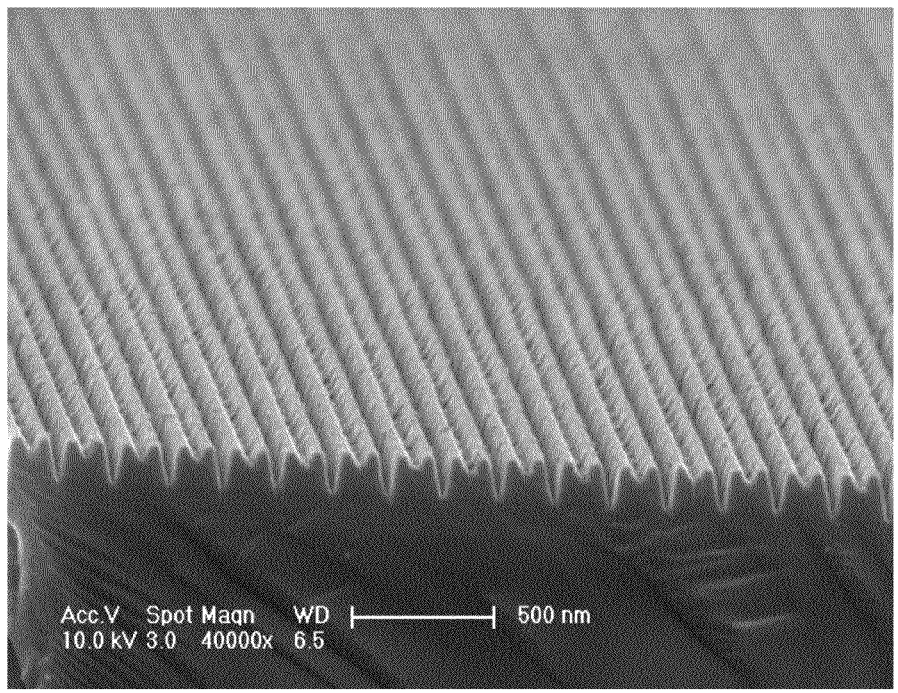
FIG. 8 is a scanning electron microscope image of the second semiconductor layer of FIG. 6.

Referring to FIG. 5, one embodiment of a semiconductor structure 50 is provided. The semiconductor structure 50 is similar to the semiconductor structure 10, except that the semiconductor structure 50 includes a plurality of three-dimensional nano-structures 143. Each of the plurality of three-dimensional nano-structures 143 is a protruding structure and has an M-shaped cross-section.

At least one component of the substrate 110, the buffer layer 116, the first semiconductor layer 120, the active layer 130, the second semiconductor layer 140, the third optical symmetric layer 150, the metallic layer 160, the fourth optical symmetric layer 170, the first optical symmetric layer 180, and the second optical symmetric layer 190 can include the plurality of three-dimensional nano-structures 143. The at least one component includes two opposite surfaces. The plurality of three-dimensional nano-structures 143 can be disposed on at least one surface of the two opposite surfaces of the at least one component. Two adjacent components including the plurality of three-dimensional nano-structures 143 of the semiconductor structure 50 can be meshed with each other via the plurality of three-dimensional nano-structures 143. The two adjacent components refer to two components contacting each other in the semiconductor structure 50. In one embodiment, the plurality of three-dimensional nano-structures 143 are disposed on the second semiconductor layer 140 away from the substrate 110, the third optical symmetric layer 150, the metallic layer 160, the fourth optical symmetric layer 170, the first optical symmetric layer 180, and the second optical symmetric layer 190 of the semiconductor structure 50, and the two adjacent components are meshed with each other via the three-dimensional nano-structures 143. The plurality of three-dimensional nano-structures 143 on different components of the semiconductor structure 50 are aligned and arranged the same.

Referring to FIGS. 5-8, the plurality of three-dimensional structures 143 disposed on a surface of the second semiconductor layer 140 away from the substrate 110 will be selected as an example to be introduced as follows. The plurality of three-dimensional structures 143 are arranged as a pattern. The plurality of three-dimensional nano-structures 143 can be arranged side by side. Each of the three-dimensional nano-structures 143 can extend along a straight line, a curvy line, or a polygonal line. The extending direction is substantially parallel with the surface of the second semiconductor layer 140. Two adjacent three-dimensional nano-structures 143 are arranged a certain distance apart from each other. The distance can be in a range from about 0 nanometers to about 200 nanometers. The extending direction of each of the plurality of three-dimensional nano-structures 143 can be fixed or varied. If the extending direction is fixed, each of the plurality of three-dimensional nano-structures 143 extends along a straight line, otherwise each of the plurality of three-dimensional nano-structures 143 extends along a polygonal line or a curvy line. The cross-section of each of the plurality of three-dimensional nano-structures 143 is M-shaped. In one embodiment, each of the plurality of three-dimensional nano-structures 143 is a bar-shaped protruding structure. The plurality of three-dimensional nano-structures 143 are substantially parallel with each other and extending along the straight line. The plurality of three-dimensional nano-structures 143 are substantially uniformly and equidistantly distributed on the entire surface of the second semiconductor layer 140.

Each of the plurality of three-dimensional nano-structures 143 extends from one side of the second semiconductor layer 140 to an opposite side along an X direction. A Y direction is substantially perpendicular to the X direction and substantially parallel with the surface of the second semiconductor layer 140. Each of the three-dimensional nano-structures 143 is a double-peak structure including a first peak 1132 and a second peak 1134. The cross-section of the double-peak structure is in a shape of an "M". The first peak 1132 and the second peak 1134 extend substantially along the X direction. The first peak 1132 includes a first surface 1132a and a second surface 1132b. The first surface 1132a and the second surface 1132b intersect to form an intersection line and an included angle of the first peak 1132. The intersection line can be a straight line, a curvy line, or a polygonal line. The included angle of the first peak 1132 is greater than 0 degrees and smaller than 180 degrees. The first surface 1132a and the second surface 1132b can be planar, curvy, or wrinkly. In one embodiment, the first surface 1132a and the second surface 1132b are substantially planar. An angle between the first surface 1132a and the surface of the second semiconductor layer 140 which intersects with the first surface 1132a is greater than 0 degrees and less than or equal to 90 degrees.

The second peak 1134 includes a third surface 1134a and a fourth surface 1134b. The structure of the second peak 1134 is substantially the same as that of the first peak 1132. The fourth surface 1134b includes a side intersecting the third surface 1134a to form an included angle of the second peak 1134, and extends to intersect the second surface 1132b of the first peak 1132 to define a first groove 1136. A second groove 1138 is defined between two adjacent three-dimensional nano-structures 143. The second groove 1138 is defined by the third surface 1134a of the second peak 1134 and the first surface 1132a of the first peak 1132 of the adjacent three-dimensional nano-structures 143.

The first peak 1132 and the second peak 1134 protrude out of the second semiconductor layer 140. A height of the first peak 1132 and the second peak 1134 can be in a range from about 150 nanometers to about 200 nanometers. The height of the first peak 1132 can be substantially equal to the height of the second peak 1134. Cross-sections of the first peak 1132 and 1134 can be trapezoidal or triangular, and shapes of the first peak 1132 and the second peak 1134 can be substantially the same. In one embodiment, the cross-sections of the first peak 1132 and the second peak 1134 are triangular.

An extending direction of the first groove 1136 is substantially parallel to the extending direction of the first peak 1132 and the second peak 1134. The cross-section of the first groove 1136 can be V-shaped. A depth of the first groove 1136 in the different three-dimensional nano-structures 143 is substantially the same. The depth of the first groove 1136 is defined as a distance between the highest point of the first peak 1132 and the lowest point of the first groove 1136. The depth of the first groove 1136 is less than the height of the first peak 1132 and the second peak 1134.

The second groove 1138 extends substantially along the extending direction of the plurality of three-dimensional nano-structures 143. A cross-section of the second groove 1138 can be V-shaped or an inverse trapezium. The cross-section of the second groove 1138 is substantially the same along the extending direction. Depths of the second grooves 1138 between each two adjacent three-dimensional nano-structures 143 are substantially the same. A depth of the second groove 1138 is defined as a distance between the highest point and the lowest point of the second groove 1138. The depth of the second groove 1138 is greater than the depth of the first groove 1136, and the ratio between the depth of the first groove 1136 and the depth of the second groove 1138 ranges from about 1:1.2 to about 1:3. The depth of the first groove 1136 ranges from about 30 nanometers to about 120 nanometers, and the depth of the second groove 1138 ranges from about 90 nanometers to about 200 nanometers. In one embodiment, the depth of the first groove 1136 is about 80 nanometers, and the depth of the second groove 1138 is about 180 nanometers.

The plurality of three-dimensional nano-structures 143 disposed on the second semiconductor layer 140 and the second semiconductor layer 140 can be an integrated structure. In other words, the plurality of three-dimensional nano-structures 143 can be a part of the second semiconductor layer 140 and the plurality of three-dimensional nano-structures 143 as a patterned structure can be formed by etching one surface of the second semiconductor layer 140. If the second semiconductor layer 140 and the plurality of three-dimensional nano-structures 143 are the integrated structure, the thickness of the second semiconductor layer 140 is greater than the heights of the first and second peaks and the depths of the first and second grooves. This principle is adapted to other components of the semiconductor structure 50 with the plurality of three-dimensional nano-structures 143.

The semiconductor structure 50 is still the optical symmetric structure having the metallic layer 160 as the symmetric center. The two components each with the plurality of three-dimensional nano-structures 143 on the two opposite sides of the metallic layer 160 have a refractive index close in value and a thickness close in value.

Referring back to FIG. 5, each layer of the second semiconductor layer 140, the third optical symmetric layer 150, the metallic layer 160, the fourth optical symmetric layer 170, the first optical symmetric layer 180, and the second optical symmetric layer 180 includes the plurality of three-dimensional nano-structures 143. Two adjacent layers are meshed with each other via the plurality of three-dimensional nano-structures 143. More specifically, a position relationship between the second semiconductor layer 140 and the third optical symmetric layer 150 is taken as an example. The second semiconductor layer 140 directly contacts the third optical symmetric layer 150 via the plurality of three-dimensional nano-structures 143. The first and second grooves of the three-dimensional nano-structures 143 on the third optical symmetric layer 150 are meshed with and filled the first and second peaks of the three-dimensional nano-structures 143 on the second semiconductor layer 140. In addition, the first and second peaks of the three-dimensional nano-structures 143 on the third optical symmetric layer 150 are meshed with and filled the first and second grooves of the three-dimensional nano-structures 143 on the second semiconductor layer 140. The three-dimensional nano-structures 143 meshed on other three-dimensional nano-structures 143 can be directly grown therefrom. The plurality of three-dimensional nano-structures 143 disposed on each layer of the semiconductor structure 50 have the same distribution and alignment.

The semiconductor structure 50 has the following advantages in operation. First, an extracting angle of the photons formed by the active layer 130 can be changed to avoid being reflected when entering the plurality of three-dimensional nano-structures 143. Thus, the light extraction efficiency can be increased. Second, if the three-dimensional nano-structures 143 are formed on the metallic layer 160, more scattering lights can be formed on the surface of the metallic layer 160. Thus, the metallic plasma can be more easily released from the metallic layer 160. Therefore, a luminous efficiency of the semiconductor structure 50 can be increased. Third, if the plurality of three-dimensional nano-structures 143 are formed on at least one surface of the active layer 130, a contact area between the active layer 130 and the first semiconductor layer 120 or the second semiconductor layer 140 can be enlarged. The electron-hole recombination density is further increased, and the light extraction efficiency of semiconductor structure 50 can be improved.

The above semiconductor structures 10, 20, 30, 40, and 50 can be widely used in solar batteries, lasers, and light emitting devices (LED).

Figure 9:
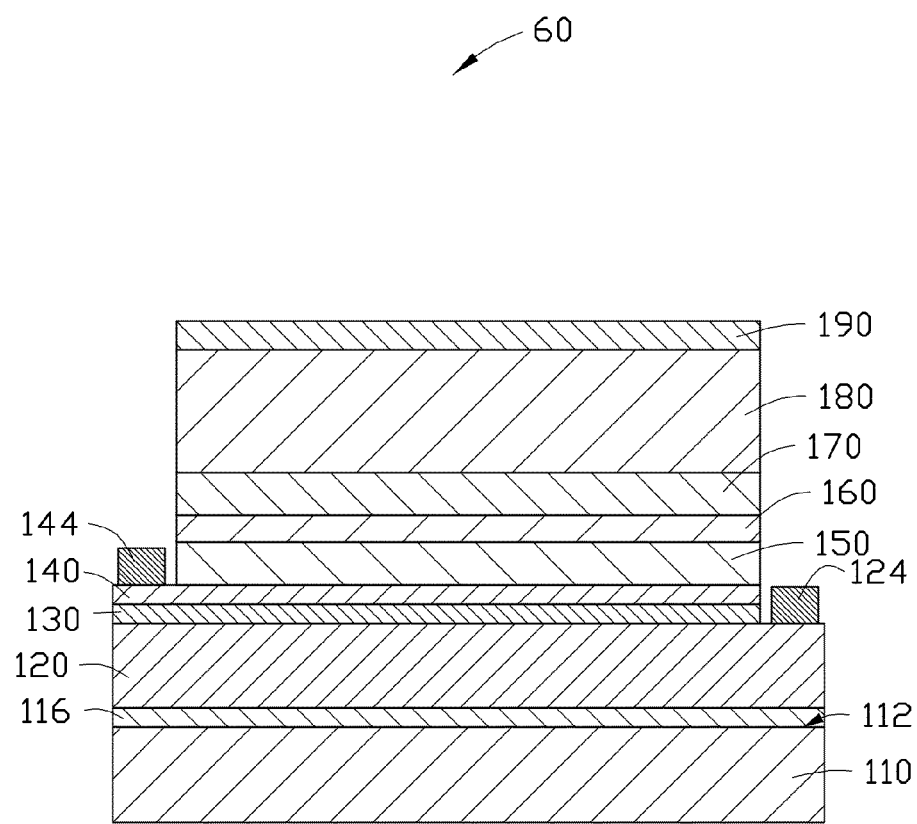
FIG. 9 is a schematic view of one embodiment of a light emitting diode.

Referring to FIG. 9, one embodiment of an LED 60 includes the substrate 110, the buffer layer 116, the first semiconductor layer 120, the active layer 130, the second semiconductor layer 140, the third optical symmetric layer 150, the metallic layer 160, the fourth optical symmetric layer 170, the first optical symmetric layer 180, the second optical symmetric layer 190, a first electrode 124, and a second electrode 144. The buffer layer 116, the first semiconductor layer 120, the active layer 130, the second semiconductor layer 140, the third optical symmetric layer 150, the metallic layer 160, the fourth optical symmetric layer 170, the first optical symmetric layer 180, and the second optical symmetric layer 190 are stacked on the surface of the substrate 110 in sequence. The first electrode 124 is disposed on a surface of the first semiconductor layer 120 away from the substrate 110 and electrically connected with the first semiconductor layer 120. The second electrode 144 is disposed on a surface of the second semiconductor layer 140 away from the substrate 110 and electrically connected with the second semiconductor layer 140. The first semiconductor layer 120, the active layer 130, and the second semiconductor layer 140 constitute the source layer. The difference $\Delta n_1$ between the refractive index $n_1$ of the first optical symmetric layer 180 and the effective refractive index $n_2$ of the source layer and the buffer layer 116 is less than or equal to 0.3, wherein $\Delta n_1 = |n_1 - n_2|$. The difference $\Delta n_2$ between the refractive index $n_3$ of the second optical symmetric layer 190 and the refractive index $n_4$ of the substrate 110 is less than or equal to 0.1, wherein $\Delta n_2 = |n_3 - n_4|$.

The first electrode 124 and the second electrode 144 are disposed on the same side of the first semiconductor layer 120.

The surface of the first semiconductor layer 120 away from the substrate 110 is defined into a first region and a second region. The active layer 130 and the second semiconductor layer 140 are stacked on the first region in sequence. The active layer 130 covers the first region of the first semiconductor layer 120. The first electrode 124 is disposed on the second region which is uncovered by the active layer 130 and electrically connected with the first semiconductor layer 120.

The surface of the second semiconductor layer 140 away from the substrate 110 is defined into a third region and a fourth region. The third optical symmetric layer 150 or the metallic layer 160 is disposed on and covers the third region. The second electrode 144 is disposed on the fourth region which is uncovered by the metallic layer 160 or the third optical symmetric layer 150 and electrically connected with the second semiconductor layer 140.

The first electrode 124 can be an N-type electrode or a P-type electrode which is consistent with the first semiconductor layer 120. The second electrode 144 can be an N-type electrode or a P-type electrode which is consistent with the second semiconductor layer 140.

The first electrode 124 or the second electrode 144 can be a layered structure including at least one layer. A thickness of the first electrode 124 or the second electrode 144 can be in a range from about 0.01 micrometers to about 2 micrometers. A material of the first electrode and the second electrode can be the same, such as titanium (Ti), silver (Ag), aluminum (Al), nickel (Ni), gold (Au) or an alloy thereof. In one embodiment, the second electrode 144 is a P-type electrode including two layers, which are a titanium layer with the thickness of about 15 nanometers and a gold layer with the thickness of about 200 nanometers. The first electrode 124 is an N-type electrode including two layers, a titanium layer with the thickness of about 15 nanometers and a gold layer with the thickness of about 100 nanometers.

In an operation of the LED 60, a voltage is applied to the first semiconductor layer 120 via the first electrode 124 and the second semiconductor layer 140 via the second electrode 144. The photons are then generated from the active layer 130 as the near field evanescent waves reaches the metallic layer 160. The metallic plasma is then generated from the metallic layer 160, spreads around, and coupled into an emergent light emitted out from the second optical symmetric layer 190. This process can increase the light extraction efficiency of the LED 60. In the process, the quantum well effect between the metallic plasma and the active layer 130 can cause the active layer 130 to produce more photons and the produced photons arrive at the metallic layer 160 to produce more metallic plasma. Therefore, a luminous efficiency of the LED 60 can be increased. The LED 60 is an optical symmetric structure with the metallic layer 160 as the symmetric center. The refractive indexes of two components of the LED 60 in the symmetric positions to the symmetric center are close. Therefore, lights can be uniformly extracted from the second optical symmetric layer 190 and the substrate 110. In addition, the third optical symmetric layer 150 and the fourth optical symmetric layer 170 disposed on the two opposite sides of the metallic layer 160 have a low refractive index. Therefore, the metallic plasma generated from the metallic layer 160 can avoid being converted to heat. Instead, a majority of the metallic plasma can be converted to light extracted out. Therefore, the light extraction efficiency of the LED 60 can be further increased.

Figure 10:
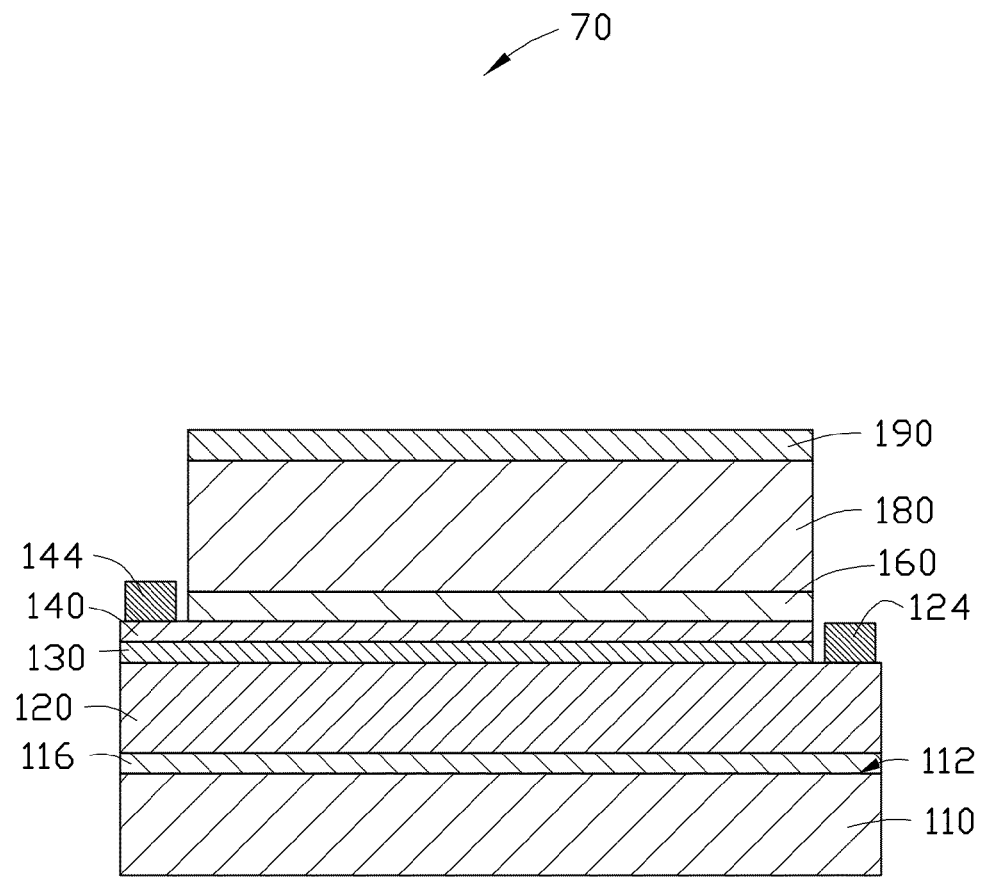
FIG. 10 is a schematic view of one embodiment of a light emitting diode.

Referring to FIG. 10, one embodiment of an LED 70 is provided. The LED 70 is substantially the same as the LED 60, except that there are no third optical symmetric layer and fourth optical symmetric layer in the LED 70.

Figure 11:
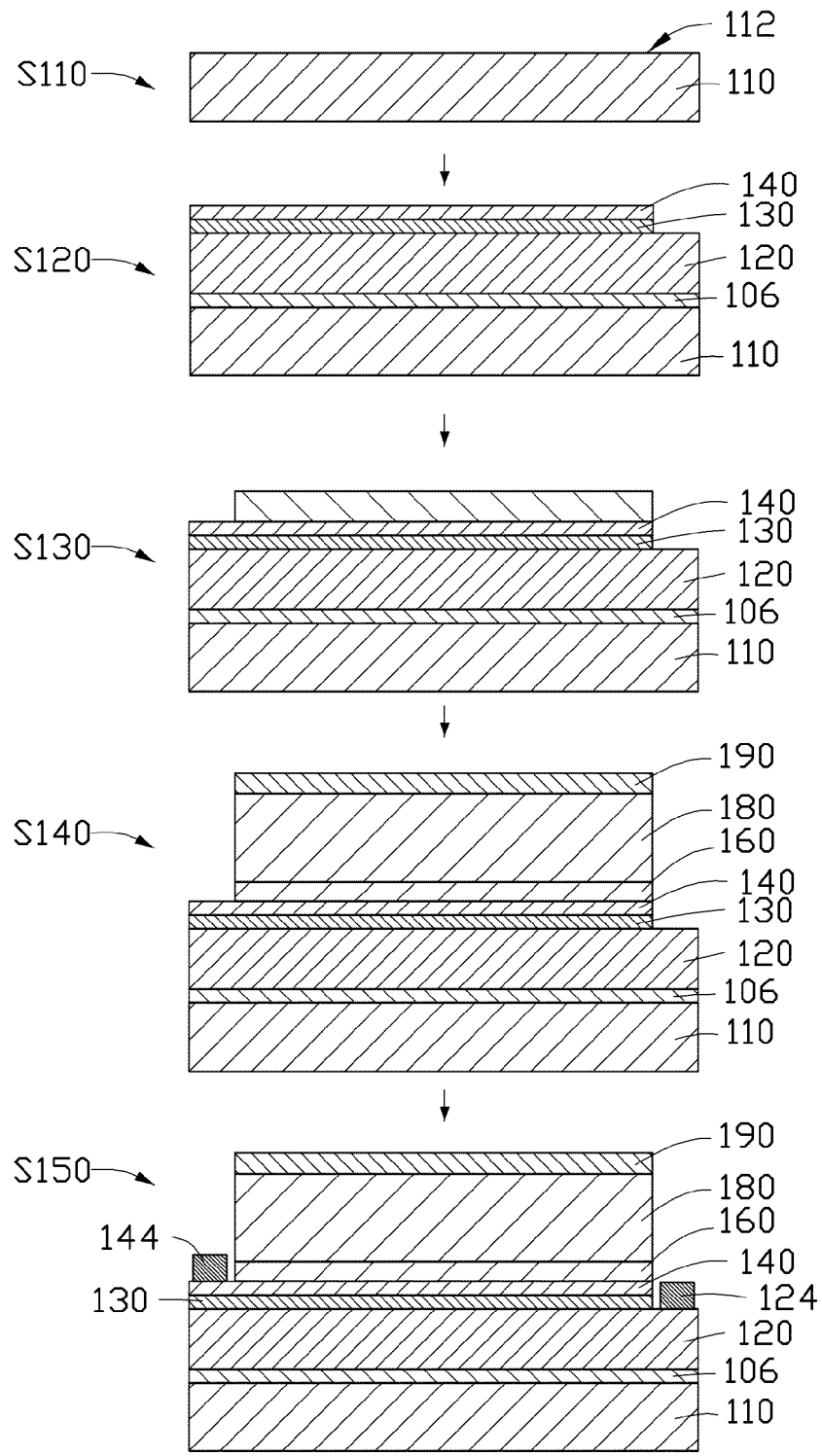
FIG. 11 is a flowchart of one embodiment of a method for making the light emitting diode of FIG. 10.

Referring to FIG. 11, one embodiment of a method for making the LED 70 includes the following steps:

S710, providing the substrate 110 with the epitaxial growth surface 112;

S720, growing the buffer layer 116 on the epitaxial growth surface 112, the first semiconductor layer 120 on the surface of the buffer layer 116, the active layer 130 on the surface of the first semiconductor layer 120, and the second semiconductor layer 140 on the surface of the active layer in sequence;

S730, forming the metallic layer 160 on the surface of the second semiconductor layer 140 away from the substrate 110;

S740, disposing the first optical symmetric layer 180 on the surface of the metallic layer 160 and the second optical symmetric layer 190 on the surface of the first optical symmetric layer 180 in sequence, the difference $\Delta n_1$ between the refractive index $n_1$ of the first optical symmetric layer 180 and the effective refractive index $n_2$ of the source layer and the buffer layer 116 being less than or equal to 0.3, wherein $\Delta n_1 = |n_1 - n_2|$, the difference $\Delta n_2$ between the refractive index $n_3$ of the second optical symmetric layer 190 and the refractive index $n_4$ of the substrate 110 is less than or equal to 0.1, and $\Delta n_2 = |n_3 - n_4|$; and S750, applying the first electrode 124 to be electrically connected with the first semiconductor layer 120, and the second electrode 144 electrically connected with the second semiconductor layer 140.

In step S720, the buffer layer 116, the first semiconductor layer 120, the active layer 130, and the second semiconductor layer 140 can grow by methods of molecular beam epitaxy (MBE), chemical beam epitaxy (CBE), reduced pressure epitaxy, selective epitaxy, liquid phase deposition epitaxy (LPE), metal organic vapor phase epitaxy (MOVPE), super vacuum chemical vapor deposition, hydride vapor phase epitaxy (HYPE), metal organic chemical vapor deposition (MOCVD), or combinations thereof. In one embodiment, the buffer layer 116, the first semiconductor layer 120, the active layer 130, and the second semiconductor layer 140 grow by the method of MOCVD.

A low temperature GaN layer is selected as the buffer layer 116. An ammonia gas as a nitrogen source, a hydrogen gas as a carrier gas, and trimethyl gallium (TMGa) or triethyl gallium (TEGa) as a gallium source to grow the low temperature GaN layer in a reactor under a low temperature.

An N-type GaN layer is selected as the first semiconductor layer 120, the ammonia gas as the nitrogen source, the TMGa or TEGa as the gallium source, silane as a Si source, and the hydrogen gas as the carrier gas to grow the N-type GaN layer in the reactor.

A process for growing the active layer 130 is substantially the same as the process of growing the first semiconductor layer 120, except that the trimethyl indium is selected as an indium source. The active layer 130 is grown on the first region of the first semiconductor layer 120 by using a photoresist as a mask. The second region of the active layer 130 is exposed to dispose the first electrode 124.

After the active layer 130 has been grown, a magnesocene ($Cp_2Mg$) is used as a magnesium source to grow the second semiconductor layer 140. The thickness of the second semiconductor layer 140 is in a range from about 5 nanometers to about 60 nanometers by controlling a growing time period. Selectively, a thick second semiconductor layer 140 can be formed by the MOCVD method and then etched or grinded to control the thickness of the second semiconductor layer 140 in the range from about 5 nanometers to about 60 nanometers.

In one embodiment, the thickness of the buffer layer 116 is about 20 nanometers, the thickness of the first semiconductor layer 120 is about 1460 nanometers, the thickness of the active layer 130 is about 10 nanometers, the thickness of the second semiconductor layer 140 is about 10 nanometers, and the total thickness thereof is about 1500 nanometers.

In step S730, the metallic layer 160 can be formed by a physical vapor deposition method depending on the selected material of the metallic layer 160, such as evaporation or sputtering. In one embodiment, a silver layer formed by evaporation is used as the metallic layer 160. A thickness of the silver layer is about 10 nanometers.

The metallic layer 160 is formed only on the third region of the second semiconductor layer 140 by using the photoresist as the mask. The fourth region is exposed to dispose the second electrode 144.

In step S740, the first optical symmetric layer 180 can be formed by evaporation or sputtering which depends on the material of the first optical symmetric layer 180. The material of the first optical symmetric layer 180 and the substrate 110 can be the same. The refractive index $n_1$ of the first optical symmetric layer 180 is in a range from about 2.2 to about 2.8. The thickness of the first optical symmetric layer 180 is in a range from about 1 micrometer to about 2 micrometers. In one embodiment, the first optical symmetric layer 180 is formed by evaporating titanium dioxide, the refractive index the first optical symmetric layer 180 is about 2.55, and the thickness is about 1500 micrometers consistent with the total thickness of the buffer layer 116 and the source layer.

The second optical symmetric layer 190 can be formed by the evaporation or sputtering. The material of the second optical symmetric layer 190 and the substrate can be the same. The thickness of the second optical symmetric layer 190 is in a range from about 30 nanometers to about 80 nanometers. In one embodiment, the material of the second optical symmetric layer 190 is aluminum oxide, and the thickness is about 50 nanometers.

One embodiment of a method for making the LED 60 includes the following steps:

S810, providing the substrate 110 with the epitaxial growth surface 112;

S820, growing the buffer layer 116 on the epitaxial growth surface 112, the first semiconductor layer 120 on the surface of the buffer layer 116, the active layer 130 on the surface of the first semiconductor layer 120, and the second semiconductor layer 140 on the surface of the active layer in sequence;

S830, forming the third optical symmetric layer 150 on the surface of the second semiconductor layer 140 away from the substrate 110, and the refractive index of the third optical symmetric layer 150 is in a range from about 1.2 to about 1.5;

S840, locating the metallic layer 160 on the surface of the third optical symmetric layer 150 away from the substrate 110;

S850, disposing the fourth optical symmetric layer 170 on the surface of the metallic layer 160 away from the substrate 110, the refractive index of the fourth optical symmetric layer 170 being in a range from about 1.2 to about 1.5;

S860, disposing the first optical symmetric layer 180 on the surface of the fourth optical symmetric layer 170, and the second optical symmetric layer 190 on the surface of the first optical symmetric layer 180 in sequence, the difference $\Delta n_1$ between the refractive index $n_1$ of the first optical symmetric layer 180 and the effective refractive index $n_2$ of the source layer and the buffer layer 116 being less than or equal to 0.3, wherein $\Delta n_1 = |n_1 - n_2|$, the difference $\Delta n_2$ between the refractive index $n_3$ of the second optical symmetric layer 190 and the refractive index $n_4$ of the substrate 110 is smaller or equal to 0.1, and $\Delta n_2 = |n_3 - n_4|$; and S870, applying the first electrode 124 electrically connected with the first semiconductor layer 120, and the second electrode 144 electrically connected with the second semiconductor layer 140.

The method for making the LED 60 is substantially the same as the method for making the LED 70, except that the third optical symmetric layer 150 is formed between the metallic layer 150 the second semiconductor layer 140, and the fourth optical symmetric layer 170 is formed between the metallic layer 150 and the first optical symmetric layer 180.

The third optical symmetric layer 150 and the fourth optical symmetric layer 170 can use the same material and can be formed by methods of electron beam evaporation, magnetron sputtering, or chemical vapor deposition. In one embodiment, a silicon oxide is deposited on the surface of the second semiconductor layer 140 to form the third optical symmetric layer 150 by the chemical vapor deposition method. The thickness of the third optical symmetric layer 150 is about 30 nanometers and the fourth optical symmetric layer 170 is about 30 nanometers thick.

The third optical symmetric layer 150 and the fourth optical symmetric layer 170 disposed on the two opposite sides of the metallic layer 160 can prevent the metallic plasma from being converted into heat.

Figure 12:
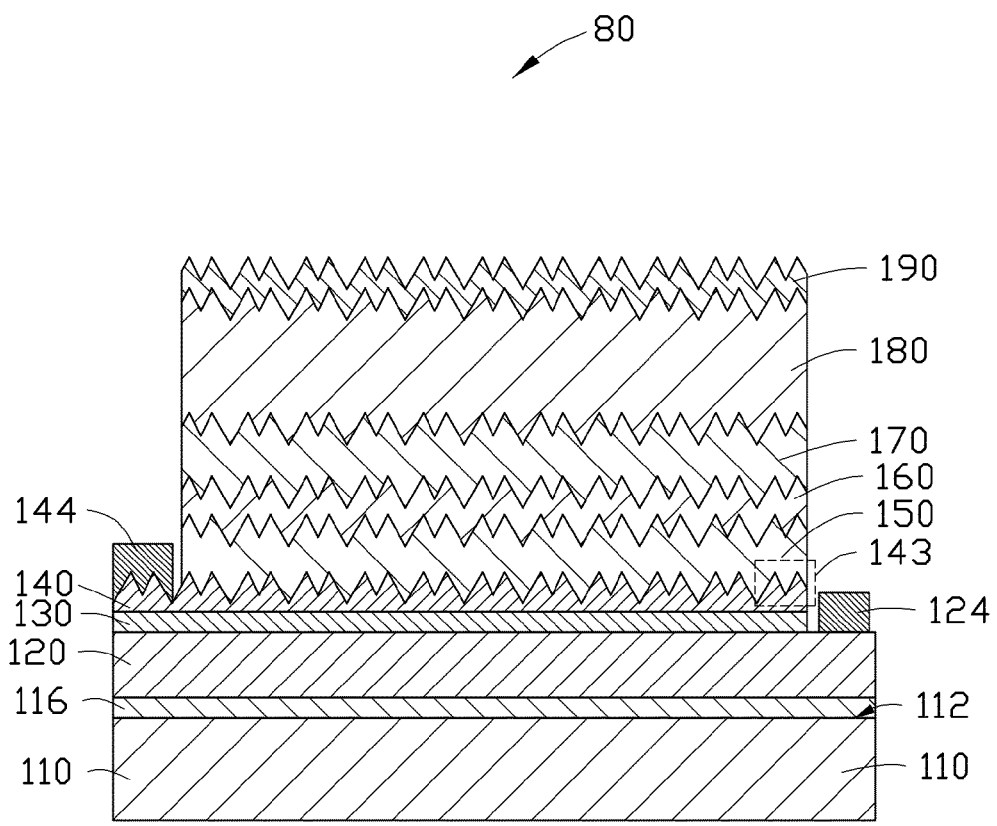
FIG. 12 is a schematic view of one embodiment of a light emitting diode.

Referring to FIG. 12, one embodiment of an LED 80 is provided. The LED 80 is substantially the same as the LED 70, except that the LED 80 includes the plurality of three-dimensional nano-structures 143. Disposing ways and positions of the plurality of three-dimensional nano-structures 143 of the LED 80 and the semiconductor structure 50 are substantially same. In one embodiment, the surface of the second semiconductor layer 140 away from the substrate 110 is patterned to form the plurality of three-dimensional nano-structures 143 and the other layers disposed on the surface of the second semiconductor layer 140 away from the substrate 110 are all patterned forming the plurality of three-dimensional nano-structures 143. The plurality of three-dimensional nano-structures 143 on different layers of the LED 80 are aligned and arranged substantially the same. The second electrode 144 directly contacts a part of the plurality of three-dimensional nano-structures 143 of the second semiconductor layer 140.

The LED 80 has the following advantages in operation. First, the extracting angle of the photons formed by the active layer 130 can be changed to avoid being reflected when entering the plurality of three-dimensional nano-structures 143. Thus, the light extraction efficiency can be increased. Second, the plurality of three-dimensional nano-structures 143 are formed on at least one surface of the active layer 130, and the contact area between the active layer 130 and the first semiconductor layer 120 or the second semiconductor layer 140 can be enlarged. The electron-hole recombination density is further increased, and the light extraction efficiency of the LED 80 can be improved. Third, the second electrode 144 directly contacts a part of the plurality of three-dimensional nano-structures 143 of the second semiconductor layer 140. Therefore, a contact area between the second electrode 144 and the second semiconductor layer 140 can be enlarged. A current applied via the second electrode 144 can be inputted into the second semiconductor layer 140.

One embodiment of a method for making the LED 80 includes the following steps:

S1010, providing the substrate 110 having the epitaxial growth surface 112;

S1020, growing the buffer layer 116 on the epitaxial growth surface 112, the first semiconductor layer 120 on the surface of the buffer layer 116, the active layer 130 on the surface of the first semiconductor layer 120, and the second semiconductor layer 140 on the surface of the active layer in sequence;

S1030, forming the plurality of three-dimensional nano-structures 143 by etching the surface of the second semiconductor layer 140 away from the substrate 110;

S1040, forming the third optical symmetric layer 150 on the surface of the second semiconductor layer 140 away from the substrate 110, the refractive index of the third optical symmetric layer 150 being in a range from about 1.2 to about 1.5;

S1050, locating the metallic layer 160 on the surface of the third optical symmetric layer 150 away from the substrate 110;

S1060, disposing the fourth optical symmetric layer 170 on the surface of the metallic layer 160 away from the substrate 110, the refractive index of the fourth optical symmetric layer 170 being in a range from about 1.2 to about 1.5;

S1070, disposing the first optical symmetric layer 180 on the surface of the fourth optical symmetric layer 170, and the second optical symmetric layer 190 on the surface of the first optical symmetric layer 180 in sequence, the difference $\Delta n_1$ between the refractive index $n_1$ of the first optical symmetric layer 180 and the effective refractive index $n_2$ of the source layer and the buffer layer 116 being less than or equal to 0.3, wherein $\Delta n_1 = |n_1 - n_2|$, the difference $\Delta n_2$ between the refractive index $n_3$ of the second optical symmetric layer 190 and the refractive index $n_4$ of the substrate 110 is smaller or equal to 0.1, and $\Delta n_2 = |n_3 - n_4|$; and S1080, applying the first electrode 124 to be electrically connected with the first semiconductor layer 120, and applying the second electrode 144 to be electrically connected with the second semiconductor layer 140.

The method for making the LED 80 is similar to the method for making the LED 60 except for the step of forming the plurality of three-dimensional nano-structures 143.

In step S1030, the plurality of three-dimensional nano-structures 143 can be formed by the following substeps:

S1031, locating a mask layer on the surface of the second semiconductor layer 140;

S1032, patterning the mask layer by a nanoimprinting and etching method;

S1033, patterning the surface of the second semiconductor layer 140 by an etching method to form a plurality of three-dimensional nano-structure preforms; and S1034, forming the plurality of the three-dimensional nano-structures 143 by removing the mask layer.

In step S1031, the mask layer can be a single layered structure or a multi-layered structure. In one embodiment, the mask layer is the multi-layered structure including a first mask layer and a second mask layer disposed on a surface of the first mask layer. The first mask layer and the second mask layer are stacked on the surface of the second semiconductor layer 140 in sequence. A material of the first mask layer is ZEP520A which is developed by Zeon Corp of Japan, a material of the second mask layer is HSQ (hydrogen silsesquioxane).

In step S1032, the mask layer can be patterned by the following steps:

S10321, providing a patterned template which includes a plurality of protruding structures spaced from and substantially parallel with each other, and a slot defined between two adjacent protruding structures;

S10322, attaching the template on the second mask layer, pressing the template at a room temperature, and removing the template to form a plurality of slots on the second mask layer;

S10323, removing the residual second mask layer in the bottom of the slot to expose the first mask layer, and S10324, patterning the mask layer by removing one part of the first mask layer corresponding with the slots to expose the second semiconductor layer 140.

In step S1033, the second semiconductor layer 140 can be placed in an inductively coupled plasma device and etched by an etching gas. In one embodiment, the etching gas is a mixed gas. The mixed gas can include $Cl_2$, $BCl_3$, $O_2$, and Ar. A power of the inductively coupled plasma device ranges from about 10 watts to about 100 watts, a flow speed of the etching gas ranges from about 8 sccm to about 150 sccm, a pressure of the etching gas can range from about 0.5 Pa to about 15 Pa, and an etching time can range from about 5 seconds to about 5 minutes. In one embodiment, the flow speed of the $Cl_2$ is about 26 sccm, the flow speed of the $BCl_3$ is about 16 sccm, the flow speed of the $O_2$ is about 20 sccm, and the flow speed of the Ar is about 10 sccm.

More specifically, the second semiconductor layer 140 can be etched by the following steps:

S10331, forming a plurality of grooves with the same depth by etching the surface of second semiconductor layer 140 with the etching gas;

S10332, continuing the etching process so that every two adjacent protruding structures begin to slant face to face to form a protruding pair; and S10333, further continuing the etching process so that the two adjacent protruding structures gradually slant until the tops of the two adjacent protruding structures contact each other.

In step S10332, the etching gas etches the exposed surface of the second semiconductor layer 140 to form the plurality of grooves. The grooves have substantially the same depth because of the same etching speed.

In step S10332, during the etching process, the etching gas will react with the exposed second semiconductor layer 140 to form a protective layer. The protective layer will reduce the etching speed of the second semiconductor layer 140, and the width of the grooves will slowly decrease from the outer surface of the second semiconductor layer 140 to the bottom of the grooves. Thus, the inner wall of the grooves will not be absolutely perpendicular to the surface of the second semiconductor layer 140, but form an angle. The etching gas not only etches the second semiconductor layer 140, but also etches the top of the protruding structures. The width of the top of the protruding structures will decrease. The resolution of the mask layer will not be affected because the speed of etching the top of the protruding structures is much smaller than that of the second semiconductor layer 140. Furthermore, every two adjacent protruding structures 1031 will slant face to face.

In step S10333, the tops of the two adjacent protruding structures 1031 will gradually approach to each other. The speed of etching the second semiconductor layer 140 corresponding to these two closed adjacent protruding structures 1031 will decrease, and the width of the grooves will gradually decrease from the outer surface of the second semiconductor layer 140 to the bottom of the grooves of the second semiconductor layer 140. Because the two adjacent protruding structures slant face to face to form the protruding pair, the speed of etching the second semiconductor layer 140 corresponding to the protruding pair will further decrease. Eventually, the tops of the two adjacent protruding structures will contact each other, and the etching gas can no longer etch the second semiconductor layer 140 corresponding to the two adjacent protruding structures. Thus, the first grooves 1136 are formed on the surface of the second semiconductor layer 140. But between every two adjacent protruding pairs, the etching speed will change less than a slant speed of the two adjacent protruding structures. Thus, the second grooves 1138 are formed, and the depth of the second grooves 1138 will be greater than that of the first grooves 1136. The plurality of three-dimensional nano-structure preforms are obtained.

In step S1034, the three-dimensional nano-structures 143 can be obtained by dissolving the mask layer. The mask layer can be dissolved in a stripping agent such as tetrahydrofuran (THF), acetone, butanone, cyclohexane, hexane, methanol, or ethanol. In one embodiment, the stripping agent is butanone, and the mask layer is dissolved in butanone and separated from the second semiconductor layer 140.

The plurality of three-dimensional nano-structures 143 can also be formed on the surface of the active layer 130 away from the substrate 110 or the surface of the first semiconductor layer 120 away from the substrate 110 by the above method. Other three-dimensional nano-structures 143 above the three-dimensional nano-structures 143 of the second semiconductor layer 140 can be formed by directly growing.

In the method for making the LED 80, the nanoimprinting and etching method is used to form the plurality of three-dimensional nano-structures 143. The nanoimpriting process can be conducted in a room temperature and the template can be directly used without being pre-treated. Therefore, the method has a simple process and low cost. In addition, a large area array of the plurality of M-shaped three-dimensional nano-structures 143 can be fabricated because that the two adjacent protruding structures of the mask layer can be contacted with each other by the gas etching to form the plurality of protruding pairs. Therefore, a yield of the LED 80 can be increased.

Figure 13:
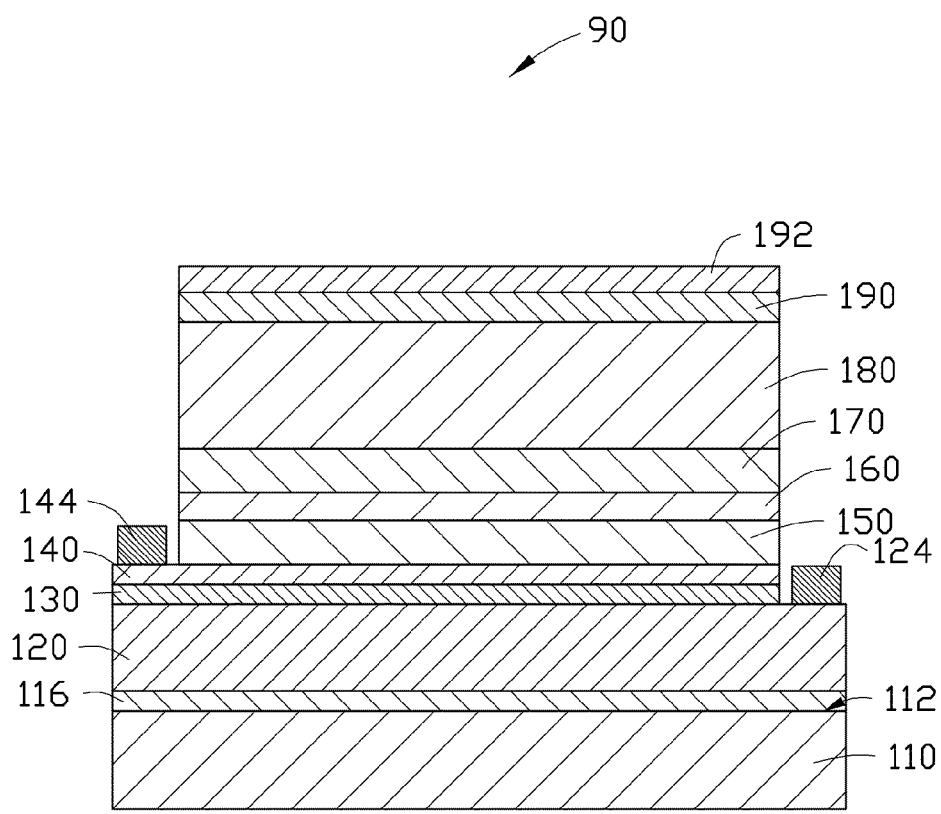
FIG. 13 is a schematic view of one embodiment of a light emitting diode.

Referring to FIG. 13, one embodiment of an LED 90 is provided. The LED 90 is substantially the same as the LED 60, except that the LED 90 further includes a reflective element 192 disposed on a surface of the second optical symmetric layer 190 away from the substrate 110.

The emergent light from the second optical symmetric layer 190 can be reflected back to the substrate 110 by the reflective element 192 to extract the light from the substrate 110. The reflective element 192 can be a layered structure directly contacting the second optical symmetric layer 190. The reflective element 192 can be a continuous layer formed by a metal material. The material of the reflective element 192 can be Al, Au, Cu, Ag, or an alloy thereof. A thickness of the reflective element 192 is selected to reflect as much emergent light from the second optical symmetric layer 190 as possible. The thickness of the reflective element 192 can be greater than 20 micrometers. In one embodiment, the material of the reflective element 192 is Ag, the thickness is about 20 nanometers, and the reflective element 192 is formed on the surface of the second optical symmetric layer 190 by a vacuum evaporation method or a magnetron sputtering method.

In addition, the reflective element 192 also can be a plurality of micro-structures disposed on the surface of the second optical symmetric layer 190 away from the substrate 110. The plurality of micro-structures can be grooves or protruding structures. The plurality of micro-structures can be at least one of V-shaped, cylindrical, semiorbicular, and pyramid-shaped with or without tips. The plurality of micro-structures are uniformly disposed on the surface of the second optical symmetric layer 190. The reflective element 192 further can include the reflective material disposed on a surface of each of the plurality of micro-structures.

The reflective element 192 disposed on the surface of the second optical symmetric layer 190 can make all lights generated from the active layer 130 extract from the substrate 110.

The reflective element 192 also can be disposed on the surface of the substrate 110 away from the active layer 130, so that all lights extract from the surface of the second optical symmetric layer 190.

All lights can extract from one surface of the LED 90 by disposing the reflective element 192. Therefore, a light intensity of the LED 90 can be increased.

Figure 14:
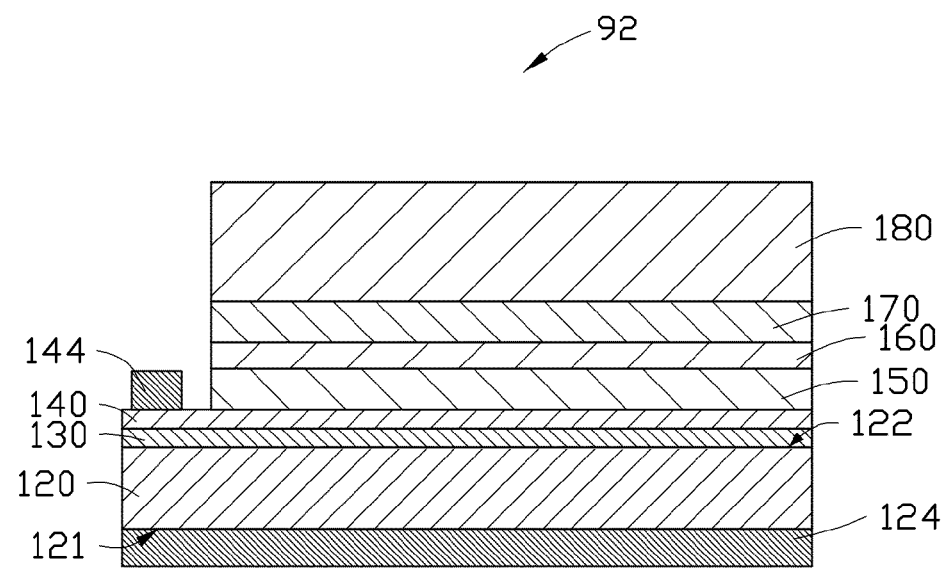
FIG. 14 is a schematic view of one embodiment of a light emitting diode.

Referring to FIG. 14, one embodiment of an LED 92 includes the first semiconductor layer 120, the active layer 130, the second semiconductor layer 140, the third optical symmetric layer 150, the metallic layer 160, the fourth optical symmetric layer 170, the first optical symmetric layer 180, the first electrode 124, and the second electrode 144. The first semiconductor layer 120 includes a first surface 121 and a second surface 122 opposite to the first surface 121. The active layer 130, the second semiconductor layer 140, the third optical symmetric layer 150, the metallic layer 160, the fourth optical symmetric layer 170, and the first optical symmetric layer 180 are stacked on the second surface 122 in the listed sequence. The first electrode 124 is disposed and covers the first surface 121. The second electrode 144 is electrically connected with the second semiconductor layer 140. The difference between the refractive index between the first optical symmetric layer 180 and the refractive index of the source layer is less than or equal to 0.3.

In the LED 92, the first electrode 124 and the second electrode 144 are positioned on two opposite sides of the first semiconductor layer 120, and the first electrode 124 covers a major part of the first surface 121. A current perpendicularly passes through the second semiconductor layer 140 of P-type with a high resistance.

The LED 92 is similar to the LED 60, except that there is no second optical symmetric layer 190, buffer layer 116, and substrate 110 in the LED 92, and the first electrode 124 covers the whole first surface 121 of the first semiconductor layer 120.

In the LED 92, the first electrode 124 and the second electrode 144 are perpendicularly disposed and faced with each other. This structure can produce a small amount of heat in the second semiconductor layer 140 as the P-typed semiconductor when applied the current. In addition, the sapphire as the substrate 110 has a poor heat dissipation. Therefore, the heat dissipation of the LED 92 can be improved without the substrate 110 of sapphire, and a lifespan of the LED 92 can be improved.

One embodiment of a method for making the LED 92 includes the following steps:

S1310, providing the substrate 110 with the epitaxial growth surface 112;

S1320, growing the buffer layer 116 on the epitaxial growth surface 112, the first semiconductor layer 120 on the surface of the buffer layer 116, the active layer 130 on the surface of the first semiconductor layer 120, and the second semiconductor layer 140 on the surface of the active layer in sequence;

S1330, forming the third optical symmetric layer 150 on the surface of the second semiconductor layer 140 away from the substrate 110;

S1340, locating the metallic layer 160 on the surface of the third optical symmetric layer 150 away from the substrate 110;

S1350, disposing the fourth optical symmetric layer 170 on the surface of the metallic layer 160 away from the substrate 110;

S1360, disposing the first optical symmetric layer 180 on the surface of the fourth optical symmetric layer 170, except that the difference between the refractive index of the first optical symmetric layer 180 and the refractive index of the source layer is less than or equal to 0.3;

S1370, exposing the first surface 121 of the first semiconductor layer 120 by removing the substrate 110 and the buffer layer 116; and S1380, locating the first electrode 124 on the first surface 121 and locating the second electrode 144 electrically connected with the second semiconductor layer 140.

The method for making the LED 92 is substantially the same as the method of making the LED 60, except that the substrate 110 and the buffer layer 116 are removed to expose the first surface 121 of the first semiconductor layer 120, there is no need to dispose the second optical symmetric layer 190, and the electrode 124 is disposed to cover the whole first surface 121 in the method of making the LED 92.

In step S1370, the substrate 110 can be removed by methods of laser irradiating, corroding, and self stripping by temperature differences.

The laser irradiating method for removing the substrate 110 includes the following substeps:

S1371, polishing and washing the surface of substrate 110 away from the first semiconductor layer 120;

S1372, placing the substrate 110 on a platform and irradiating the polished surface of the substrate 110 by the laser; and S1373, immersing the irradiated substrate 110 in a solution to remove the substrate 110.

In step S1371, the surface of the substrate 110 away from the first semiconductor layer 120 can be polished by mechanical polishing or chemical polishing. The polished surface becomes smooth to decrease a scattering of the laser irradiating. The polished surface can be washed by a chlorhydric acid or a sulfuric acid to remove metal impurities, grease, and dirt.

In step S1372, an irradiating direction is substantially perpendicular to the polished surface. The laser can access the substrate 110 and reach to the first semiconductor layer 120 to strip the substrate 110 from the first semiconductor layer 120. An energy of the laser is smaller than a band gap energy of the substrate 110 and greater than the band gap energy of the first semiconductor layer 120. The buffer layer 116 can strongly absorb the laser energy, thereby results a decomposition thereof due to a rapidly increasing temperature. In one embodiment, the material of the first semiconductor layer 120 is the GaN and the band gap energy is about 2.2 electron volts (ev), the material of the substrate 110 is the sapphire and the band gap energy is about 9.9 ev; the material of the buffer layer 116 is the low temperature GaN, the laser is a KrF laser, a laser wavelength of the KrF laser is about 248 nanometers and the energy is about 5 ev, a pulse width of the KrF laser is in a range from about 20 nanoseconds to about 40 nanoseconds, an energy density is about 400 mJ/cm$^2$ to about 600 mJ/cm$^2$, a spot shape is rectangle, a size of the spot is about 0.5 micrometers×0.5 micrometers, the laser scans starting from an edge of the polished surface, and a scanning step is about 0.5 mm/s. The low temperature GaN is decomposed to a Ga and N$_2$.

The buffer layer 116 has a strong laser absorption which results in the rapidly increasing temperature, thus the buffer layer 116 is decomposed. The first semiconductor layer 120 has weak laser absorption. Therefore, the laser will not damage the first semiconductor layer 120.

The process of the laser irradiating is conducted in a vacuum or an atmosphere filled with a protecting gas. The protecting gas can be nitrogen, helium, argon, or combinations thereof.

In step S1373, the irradiated substrate 110 can acidize by immersing in an acid solution. The acid solution can dissolve the decomposed Ga from the buffer layer 116. Therefore, the substrate 110 is stripped from the first semiconductor layer 120. The acid solution can be a hydrochloric acid, nitric acid, or a sulfuric acid.

Figure 15:
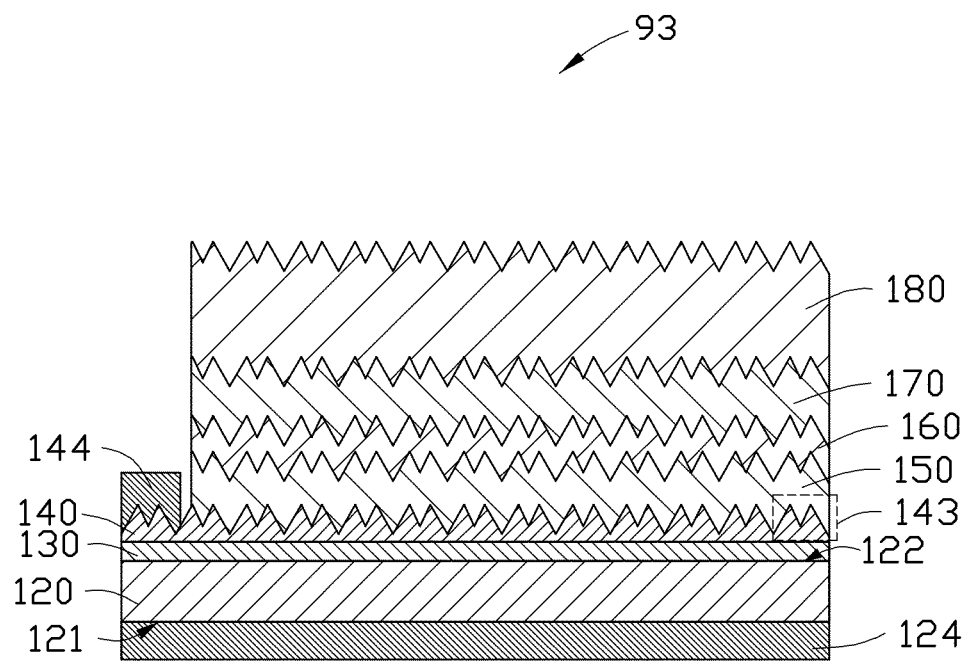
FIG. 15 is a schematic view of one embodiment of a light emitting diode.

Referring to FIG. 15, one embodiment of an LED 93 is provided. The LED 93 is similar to the LED 92, except that the LED 93 includes the plurality of three-dimensional nano-structures 143. An arrangement of the plurality of three-dimensional nano-structures 143 of the LED 93 are substantially the same as the arrangement of the plurality of three-dimensional nano-structures 143 in the semiconductor structure 80 except that there is no second optical symmetric layer 190 in the LED 93. More specifically, the plurality of three-dimensional nano-structures 143 can be formed on at least one layer of the first semiconductor layer 140, the third optical symmetric layer 150, the metallic layer 160, the fourth optical symmetric layer 170, and the first optical symmetric layer 180 of the LED 93. In one embodiment, the plurality of three-dimensional nano-structures 143 are formed on each layer of the first semiconductor layer 140, the third optical symmetric layer 150, the metallic layer 160, the fourth optical symmetric layer 170, and the first optical symmetric layer 180 of the LED 93.

One embodiment of a method for making the LED 93 includes the following steps:

S1510, providing the substrate 110 with the epitaxial growth surface 112;

S1520, growing the buffer layer 116 on the epitaxial growth surface 112, the first semiconductor layer 120 on the surface of the buffer layer 116, the active layer 130 on the surface of the first semiconductor layer 120, and the second semiconductor layer 140 on the surface of the active layer in sequence;

S1530, forming the plurality of three-dimensional nano-structures 143 by etching the surface of the second semiconductor layer 140 away from the substrate 110;

S1540, forming the third optical symmetric layer 150 on the surface of the second semiconductor layer 140 away from the substrate 110;

S1550, forming the metallic layer 160 on the surface of the third optical symmetric layer 150 away from the substrate 110;

S1560, disposing the fourth optical symmetric layer 170 on the surface of the metallic layer 160 away from the substrate 110;

S1570, disposing the first optical symmetric layer 180 on the surface of the fourth optical symmetric layer 170, the difference between the refractive index of the first optical symmetric layer 180 and the refractive index of the source layer being less than or equal to 0.3;

S1580, exposing the first surface 121 of the first semiconductor layer 120 by removing the substrate 110; and S1590, locating the first electrode 124 on the first surface 121 and locating the second electrode 144 electrically connected with the second semiconductor layer 140

The method for making the LED 93 is similar to the method for making the LED 92 except that the plurality of three-dimensional nano-structures 143 in the LED 93 are formed. The process for forming the plurality of three-dimensional nano-structures 143 in the LED 93 is substantially the same as the process in making the semiconductor structure 80.

Figure 16:
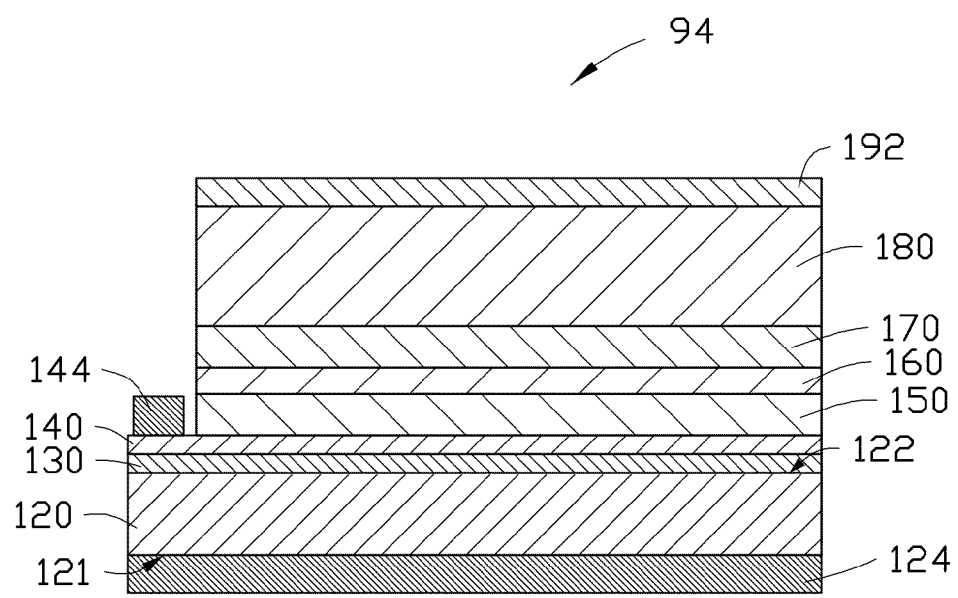
FIG. 16 is a schematic view of one embodiment of a light emitting diode.

Referring to FIG. 16, one embodiment of an LED 94 is provided. The LED 94 is substantially the same as the LED 92, except that the LED 94 further includes the reflective element 192 disposed on a surface of the first optical symmetric layer 180 away from the first semiconductor layer 120.

The emergent light generated from the active layer 130 can be reflected back to the first electrode 124, thereby the emergent lights can be concentrate extracted from the first electrode 124. Therefore, the LED 94 has a good light extraction efficiency.

Figure 17:
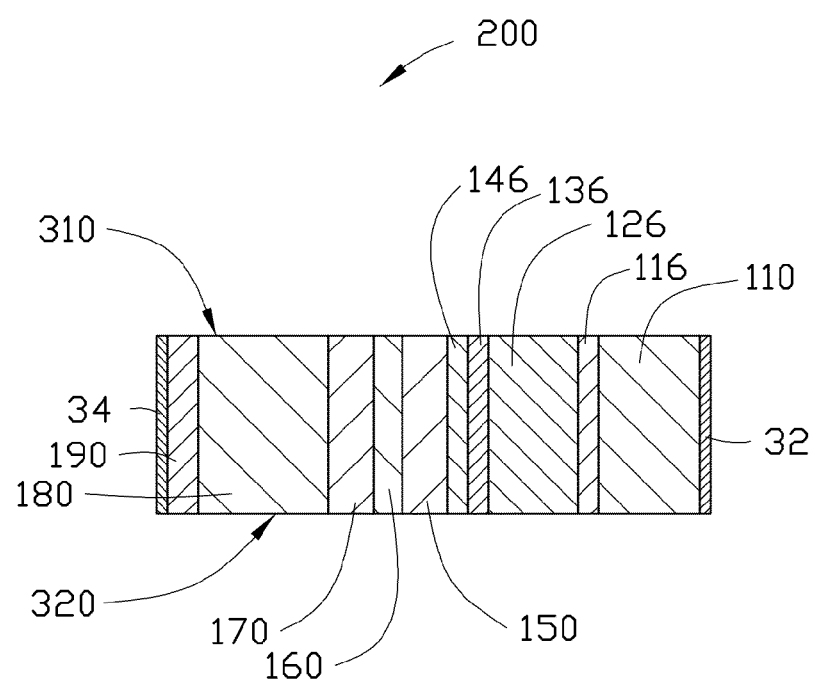
FIG. 17 is a schematic view of one embodiment of a solar cell.

Referring to FIG. 17, one embodiment of a solar cell 200 includes a first collecting electrode 32, the substrate 110, the buffer layer 116, the first silicon layer 126, a photovoltaic layer 136, a second silicon layer 146, the third optical symmetric layer 150, the metallic layer 160, the fourth optical symmetric layer 170, the first optical symmetric layer 180, the second optical symmetric layer 190, and a second collecting electrode 34. The substrate 110, the buffer layer 116, the first silicon layer 126, the photovoltaic layer 136, the second silicon layer 146, the third optical symmetric layer 150, the metallic layer 160, the fourth optical symmetric layer 170, the first optical symmetric layer 180, the second optical symmetric layer 190, and the second collecting electrode 34 are stacked on a surface of the first collecting electrode 32 in the listed sequence. The refractive index of the third optical symmetric layer 150 is substantially the same as the refractive index of the fourth optical symmetric layer 170. The first silicon layer 126, the photovoltaic layer 136, and the second silicon layer 146 constitutes a second source layer. A difference between the refractive index of the first optical symmetric layer 180 and a second effective refractive index of the second source layer and the buffer layer 116 is less than or equal to 0.3. The refractive index difference between the second optical symmetric layer 190 and the substrate 110 is less than or equal to 0.1. The solar cell 200 is an optical symmetric structure with the metallic layer 160 as the optical symmetric center. A structure of the solar cell 200 is similar to the semiconductor structure 10.

The substrate 110, the buffer layer 116, the third optical symmetric layer 150, the fourth optical symmetric layer 170, and the second optical symmetric layer 190 of the solar cell 200 are optional elements. The substrate 110, the buffer layer 116, and the second optical symmetric layer 190 should exist or be absent in the solar cell 200 together to ensure the optical symmetric structure of the solar cell. Similarly, the third optical symmetric layer 150 and the fourth optical symmetric layer 170 should exist or be absent in the solar cell 200 together to ensure the optical symmetric structure of the solar cell.

A semiconductor type between the first silicon layer 126 and the second silicon layer 146 are opposite. The first silicon layer 126 can be N-typed or P-typed. In one embodiment, the first silicon layer 126 is P-typed, the second silicon layer 146 is N-typed. A material and a thickness of the photovoltaic layer 136 are substantially the same as the material and the thickness of the semiconductor structure 10.

The first collecting electrode 32 and the second collecting electrode 34 can be made with a same material or different materials. The first collecting electrode 32 or the second collecting electrode 34 can be a metal plate with a continuous surface. The material of the first collecting electrode 32 or the second collecting electrode 34 can be Al, Cu, Ag, or an alloy thereof. A thickness of the first collecting electrode 32 or the second collecting electrode 34 can be in a range from about 50 nanometers to about 300 nanometers. In one embodiment, both the first collecting electrode 32 and the second electrode 34 are bar-shaped Al foils with the thickness of about 200 nanometers.

The solar cell 200 includes a light-input surface 310 and a light-output surface 320. One side of the substrate 110, the buffer layer 116, the first silicon layer 126, the photovoltaic layer 136, the second silicon layer 146, the third optical symmetric layer 150, the metallic layer 160, the fourth optical symmetric layer 170, the first optical symmetric layer 180, and the second optical symmetric layer 190 constitute the light-input surface 310. An opposite side of the side of the substrate 110, the buffer layer 116, the first silicon layer 126, the photovoltaic layer 136, the second silicon layer 146, the third optical symmetric layer 150, the metallic layer 160, the fourth optical symmetric layer 170, the first optical symmetric layer 180, and the second optical symmetric layer 190 constitute the light-output surface 320 of the solar cell 200.

Sunlight irradiates the light-input surface 310 and reaches the metallic layer 160. The metallic plasma is then generated from the metallic layer 160. The metallic plasma is absorbed by a P-N conjunction formed by the first silicon layer 126 and the second silicon layer 136 to form larger amounts of electrons and holes. The electrons move to the second collecting electrode 34 and the holes move to the first collecting electrode 32 to form a current.

Figure 18:
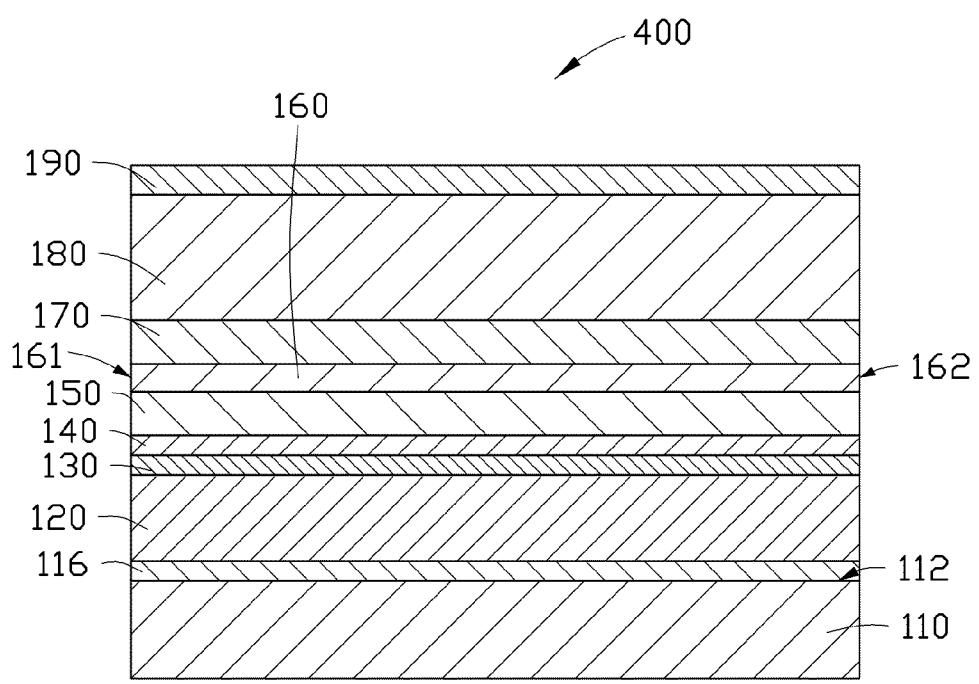
FIG. 18 is a schematic sectional view of one embodiment of a waveguide.

Referring to FIG. 18, one embodiment of a waveguide 400 is provided. The waveguide 400 is substantially the same as the semiconductor structure 10. The metallic layer 160 of the waveguide 400 includes a first side 161 and a substantially parallel and opposite second side 162. Electromagnetic waves can enter from the first side 161 and pass through from the second side 162. The metallic plasma is generated when the entered electromagnetic waves reaches the metallic layer 160. The metallic plasma carrying information of the electromagnetic waves spreads in the metallic layer 160 and then is converted back to the electromagnetic waves when reaching the second side 163. Therefore, the waveguide 400 can conduct the electromagnetic waves. In addition, the waveguide 400 is the optical symmetric structure, the metallic plasma can be restricted in the metallic layer 160 and uniformly conducted in the metallic layer 160.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A light emitting diode comprising:
a substrate;
a source layer comprising a first semiconductor layer, an active layer, and a second semiconductor layer stacked on a surface of the substrate in the listed sequence;
a first electrode electrically connected with first semiconductor layer;
a second electrode electrically connected with the second semiconductor layer;
a third optical symmetric layer disposed on and contacting a surface of the second semiconductor layer away from the substrate, wherein a refractive index of the third optical symmetric layer is in a range from about 1.2 to about 1.5;
a metallic layer disposed on and contacting a surface of the third optical symmetric layer away from the substrate;
a fourth optical symmetric layer disposed on and contacting a surface of the metallic layer away from the substrate, wherein a refractive index of the fourth optical symmetric layer is in a range from about 1.2 to about 1.5;
a first optical symmetric layer disposed on and contacting a surface of the fourth optical symmetric layer away from the substrate, wherein a refractive index difference between the source layer and the first optical symmetric layer is less than or equal to 0.3; and
a second optical symmetric layer disposed on a surface of the first semiconductor layer away from the substrate, wherein a refractive difference between the second optical symmetric layer and the substrate is less than or equal to 0.1.

2. The light emitting diode of claim 1, wherein a material of the metallic layer is selected from the group consisting of gold, silver, aluminum, copper, and an alloy thereof.

3. The light emitting diode of claim 1, wherein the refractive index of the third optical symmetric layer is substantially the same as the refractive index of the fourth optical symmetric layer.

4. The light emitting diode of claim 1, wherein a material of the third optical symmetric layer or the fourth optical symmetric layer is selected from the group consisting of silicon dioxide, magnesium fluoride, and lithium fluoride.

5. The light emitting diode of claim 1, wherein a thickness of the third optical symmetric layer or the fourth optical symmetric layer is in a range from about 5 nanometers to about 40 nanometers.

6. The light emitting diode of claim 1, wherein a refractive index of the first optical symmetric layer is in a range from about 2.0 to about 3.5.

7. The light emitting diode of claim 1, wherein a material of the first optical symmetric layer is selected from the group consisting of titanium dioxide, hafnium oxide, zirconia, yttria, and polyimide.

8. The light emitting diode of claim 1, wherein a thickness of the first optical symmetric layer is substantially the same as a thickness of the source layer.

9. The light emitting diode of claim 1, wherein a material of the second optical symmetric layer is substantially the same as a material of the substrate.

10. The light emitting diode of claim 1, wherein a thickness of the second optical symmetric layer is in a range from about 30 nanometers to about 80 nanometers.

11. The light emitting diode of claim 1 further comprising a plurality of three-dimensional nano-structures disposed on and contacting at least one of the first semiconductor layer, the active layer, the second semiconductor layer, the metallic layer, the third optical symmetric layer, the fourth optical symmetric layer, the first optical symmetric layer, and the second optical symmetric layer.

12. The light emitting diode of claim 11, wherein the plurality of three-dimensional nano-structures are substantially parallel to each other, each of the plurality three-dimensional nano-structures comprises a first peak and a second peak, the first peak and the second peak extend substantially along a same direction, a first groove is defined between two adjacent first peaks and a second groove is defined between two adjacent three-dimensional nano-structures, and a depth of the first groove is smaller than a depth of the second groove.

13. The light emitting diode of claim 11, wherein a cross section of each of the plurality of three-dimensional nano-structures along the extending direction is M-shaped.

* * * * *